(12) United States Patent
Narita

(10) Patent No.: US 6,989,833 B2
(45) Date of Patent: Jan. 24, 2006

(54) WAVEFORM INFORMATION DISPLAY APPARATUS

(75) Inventor: Yoshimasa Narita, Saitama (JP)

(73) Assignee: Iwatsu Electric Co., Ltd., Tokyo (JP)

( * ) Notice: Subject to any disclaimer, the term of this patent is extended or adjusted under 35 U.S.C. 154(b) by 413 days.

(21) Appl. No.: 10/201,128

(22) Filed: Jul. 24, 2002

(65) Prior Publication Data

US 2004/0017366 A1    Jan. 29, 2004

(51) Int. Cl.
*G09G 5/22* (2006.01)
*G01R 13/02* (2006.01)
(52) U.S. Cl. .................. 345/440.1; 345/555; 345/208; 702/67
(58) Field of Classification Search ............ 345/440.1, 345/208, 501, 555; 702/66–78
See application file for complete search history.

(56) References Cited

U.S. PATENT DOCUMENTS

| 5,397,981 A | * | 3/1995 | Wiggers ................. 324/121 R |
| 5,790,133 A | * | 8/1998 | Holcomb et al. ........... 345/501 |
| 6,507,796 B2 | * | 1/2003 | Alexander ................... 702/70 |

* cited by examiner

*Primary Examiner*—Amr A. Awad
(74) *Attorney, Agent, or Firm*—Oblon, Spivak, McClelland, Maier & Neustadt, P.C.

(57) ABSTRACT

The invention provides a waveform information display apparatus, wherein the property of waveform data is grasped by the light of nature. Specifically, digital waveform data stored in a memory is split into a plurality of time segments, and compressed display data is generated in each of the time segments. A waveform is displayed on the screen by the compressed display data. Then, a property specified for the waveform is extracted from the digital waveform data in each of the time segments, and a value expressing the specified property in the time segment is obtained on the basis of the extracted property. Further, a waveform display portion in each of the time segments displayed on the screen on the basis of the compressed display data in each of the time segments is displayed in a state wherein the obtained value expressing the property is reflected on the waveform display portion.

16 Claims, 25 Drawing Sheets

| Time division | Start address of stored waveform | Plus pulse width | Remarks |
|---|---|---|---|
| B | 497286 | 150ns | Pulse a |
| C | 498114 | 5ns | Pulse b |
|   | 498295 | 50ns | Pulse c |
|   | 498643 | 20ns | Pulse d |
|   | 498786 | 25ns | Pulse e |
| D | 499243 | 15ns | Pulse f |
|   | 499923 | 60ns | Pulse g |
| E | 500286 | 50ns | Pulse h |
|   | 500671 | 40ns | Pulse i |

Fig. 19

| Time division | Start address of stored waveform | Detected plus pulse width | Remarks |
|---|---|---|---|
| B | 497286 | 150ns | Pulse a |
| C | 498114 | 5ns | Pulse b |
| D | 499243 | 15ns | Pulse f |
| E | 500671 | 40ns | Pulse i |

Fig. 20

| Time division | Start address of stored waveform | Detected plus pulse width | Remarks |
|---|---|---|---|
| B | 497286 | 150ns | Pulse a |
| C | 498295 | 50ns | Pulse c |
| D | 499923 | 60ns | Pulse g |
| E | 500286 | 50ns | Pulse h |

Fig. 21

| Time division | Within range of setting | Start address of stored waveform | Detected plus pulse width | Remarks |
|---|---|---|---|---|
| B | Yes | 497286 | 150ns | Pulse a |
| C | non | - | - | - |
| D | non | - | - | - |
| E | non | - | - | - |

Fig. 22

| Division | Plus pulse width (+PW) | Brightness |
|---|---|---|
| 11 | 100ns | −50% |
| 10 | 90ns<+PW≦100ns | 0% |
| 9 | 80ns<+PW≦90ns | +10% |
| 8 | 70ns<+PW≦80ns | +20% |
| 7 | 60ns<+PW≦70ns | +30% |
| 6 | 50ns<+PW≦60ns | +40% |
| 5 | 40ns<+PW≦50ns | +50% |
| 4 | 30ns<+PW≦40ns | +60% |
| 3 | 20ns<+PW≦30ns | +70% |
| 2 | 10ns<+PW≦20ns | +80% |
| 1 | +PW≦10ns | +90% |

Fig. 23

| Time division | Brightness |
|---|---|
| B | −50% |
| C | +90% |
| D | +80% |
| E | +60% |

Fig. 24

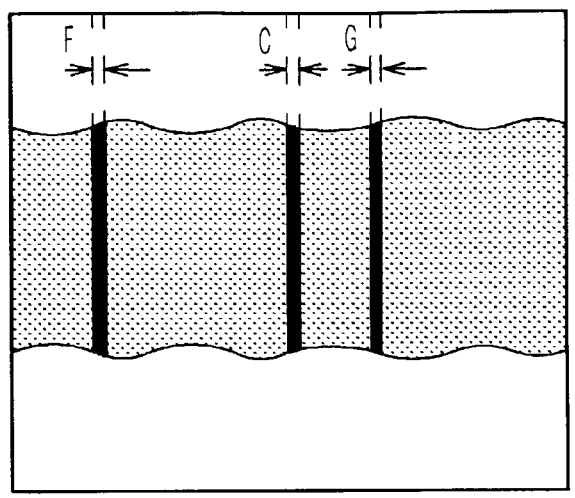
Fig. 27
| Time division | Start address of stored waveform | Detected plus pulse width in the time division | Remarks |
|---|---|---|---|
| C | 498114 | 5 ns | pulse b |
| F | 334561 | 7 ns | pulse j |
| G | 858443 | 10 ns | pulse k |
Fig. 28
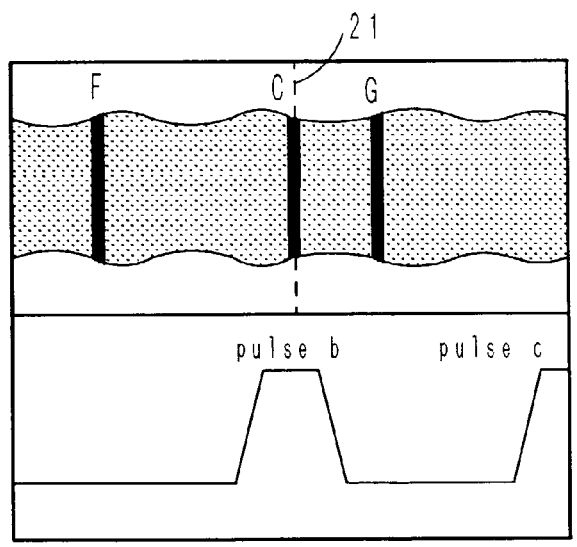
Fig. 29

| Time division | Number of plus pulse |
|---|---|
| (I) | (2) |
| J | 2 |
| K | 5 |
| L | 2 |
| M | 2 |
| N | 0 |
| O | 4 |
| P | 4 |
| (Q) | (1) |

| Adjacent time division | Number of plus pulse |
|---|---|
| J-K | 7 |
| L-M | 4 |
| N-O | 4 |
| P-Q | 5 |

| Adjacent time division | Number of plus pulse |
|---|---|
| I-J | 4 |
| K-L | 7 |
| M-N | 2 |
| O-P | 8 |

Fig. 36

| division | Number of plus pulse K | Brightness |
|---|---|---|
| 2 | 11 < K or K < 5 | -50% |
| 1 | 5 ≦ K ≦ 11 | 100% |

Fig. 37

| Time division | Brightness |
|---|---|
| J | -50% |
| K | +100% |
| L | -50% |
| M | -50% |
| N | -50% |
| O | -50% |
| P | -50% |

Fig. 38

| Adjacent time division | Brightness |
|---|---|
| J-K | +100% |
| L-M | -50% |
| N-O | -50% |
| P-Q | +100% |

Fig. 39

| Adjacent time division | Brightness |
|---|---|
| I-J | -50% |
| K-L | +100% |
| M-N | -50% |
| O-P | +100% |

Fig. 40

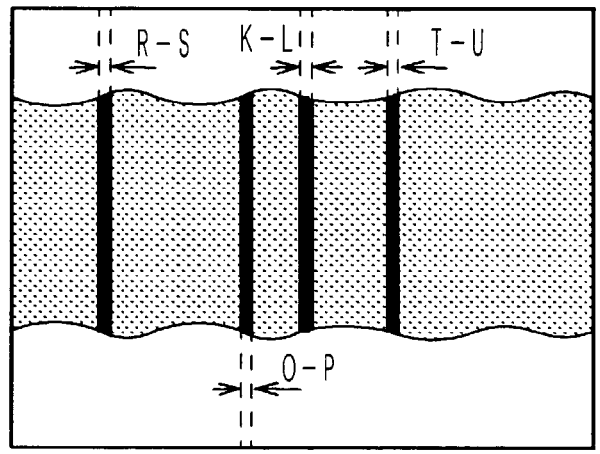
Fig. 44
| Adjacent time division | Start address of stored waveform | Number of pulse in the time division |
|---|---|---|
| R-S | 206000 | 8 |
| K-L | 497000 | 7 |
| O-P | 499000 | 8 |
| T-U | 735000 | 9 |
Fig. 45
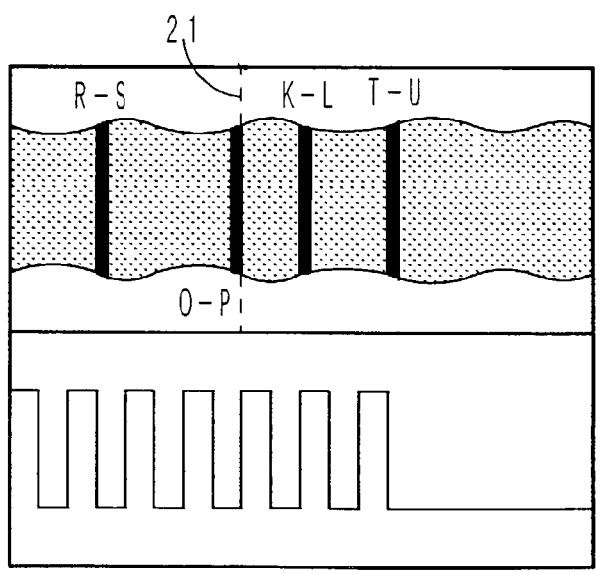
Fig. 46

WAVEFORM INFORMATION DISPLAY APPARATUS

BACKGROUND OF THE INVENTION

1. Field of the Invention

The present invention relates to a waveform information display apparatus such as a digital oscilloscope, and particularly relates to a waveform information display apparatus for displaying display data on which the property of captured waveform data is reflected.

2. Related Art

In analog oscilloscopes, a waveform based on an analog input signal is displayed continuously on a cathode ray tube (CRT) having a certain persistence characteristic. Therefore, the frequency information of the waveform is displayed as brightness on the screen. However, in the analog oscilloscopes, all processings are carried out in real time, and the displayed data is regarded as transient and is not stored internally. Thus, the data displayed on the CRT disappears when persistent time has passed.

It is therefore difficult to measure and display any property of the waveform such as a frequency, a period, a maximum value or a minimum value except the waveform itself. Indeed, in some analog oscilloscopes, not only a waveform but also its frequency, period, maximum value, minimum value, etc. are measured and displayed by analog processing. There is however room for improvement in displaying the properties of the wave form concurrently with the waveform itself.

On the other hand, in digital oscilloscopes, an analog input signal is sampled at a regular time interval and converted into digital waveform data. The converted waveform data is stored in an internal memory. Then, a waveform corresponding to the analog input signal is displayed on a raster scanning display unit or the like on the basis of the digital waveform data stored in the internal memory.

In such a manner, in the digital oscilloscopes, since the digital waveform data is stored in the internal memory, various arithmetic processings can be carried out on the stored digital waveform data, and the results of the processings can be displayed concurrently on the screen displaying the waveform.

However, the display in the digital oscilloscopes has the following problems.

In the raster scanning display unit typically used in the digital oscilloscopes, the display resolving power of a normal display screen in the direction of the time axis is only about 1,000 points. Accordingly, in order to match a plurality of pieces of digital waveform data of 1,000 or more points with the display resolving power of about 1,000 points, the digital waveform data is divided into time segments each having a predetermined length corresponding to the display resolving power. Data in the same time segment is compressed to generate compressed display data, and a compressed waveform is displayed on the basis of the compressed display data.

As for the method for displaying the compressed waveform, there is a method in which a maximum value and a minimum value of data in the same time segment are obtained, connected in the vertical axis direction and displayed, or a method in which all pieces of data in the same time segment are displayed on a specific line in the vertical axis direction.

However, in such a compressed waveform display method for digital oscilloscopes, waveform frequency information cannot be expressed on the screen as perfectly as that in analog oscilloscopes. Accordingly, there is another display method in which the frequency of occurrence of each piece of data in the vertical axis direction is obtained from the data in the same time segment, and identification (for example, identification by brightness, density, color or pattern corresponding to the frequency of occurrence) is applied to display data in accordance with the frequency of occurrence frequency of the display data.

In addition, the description has been made on the assumption that waveform data captured in certain time series is displayed whenever the waveform data is captured. However, display like an analog oscilloscope can be attained if the accumulated frequency of occurrence of repeatedly captured data in the same time segment is obtained, and identification using brightness, density, color or pattern by way of example is applied to display data in accordance with the frequency of occurrence of the display data. Nowadays, digital oscilloscopes in which these functions are incorporated to enable display like an analog oscilloscope have also been produced on a commercial basis.

In such a manner, the method for applying identification (brightness, density, color or pattern) to the display of a digital oscilloscope in accordance with the frequency of occurrence of data is chiefly intended to make the display of the digital oscilloscope more approach to the display of an analog oscilloscope. The method becomes effective when the number of elements composing a waveform contained in one time segment is not very large.

However, with the increase of the memory capacity, the number of points of digital waveform data captured at one time may increase to about several tens of megas, and the number of elements composing a waveform contained in one time segment may increase. In such a case, it will be difficult to grasp the outline of the waveform correctly by only applying the frequency of occurrence to display data.

Further, various functions for arithmetically processing the stored digital waveform data are indeed attained in digital oscilloscopes. For example, an automatic measuring function for measuring the pulse width of a positive-direction pulse (hereinafter, referred to as "+ pulse width") has been attained. However, in the prior art, the result of such an arithmetic processing is not added directly to the waveform data but is provided in a display form different from the display form of the waveform data. For example, the arithmetic processing result is displayed as numeric data or displayed as a trend waveform (in which an event and a result for grasping a trend are displayed two-dimensionally) or as a histogram.

When the arithmetic processing result is provided as numeric data, it is difficult to grasp the property of a waveform by the light of nature. On the other hand, when the arithmetic processing result is provided as a trend waveform or a histogram, it is possible to grasp the property of the waveform by the light of nature but it is difficult to grasp the relationship with the compressed display waveform correctly. Further, it is necessary to perform the display of the waveform itself and the display of such numeric data, a trend waveform or a histogram concurrently. Therefore, there also arises a problem that effective use of a waveform display area becomes difficult when it is desired to use the wave form display area for another purpose. For example, when a large volume of digital waveform data is observed, an entire waveform and a partial waveform thereof zoomed in on (zoomed waveform) are often displayed concurrently. It is therefore required a waveform information display method in which the property of a displayed waveform can be grasped by the light of nature without displaying any extra display other than the display of the waveform itself.

In addition, a zoomed waveform showing an enlarged part of the entire waveform is used for observing the details of the waveform data. However, when the number of points of digital waveform data captured at one time reaches about several tens of megas with the increase of the memory capacity, it is necessary to check several thousands of screens of waveform data in order to check the entire waveform in a horizontal axis range (time axis range) with which the details of the waveform can be checked. Thus, it becomes quite difficult to attain such check.

Most observers do not intend to observe all the waveform data but intend to examine presence/existence of a glitch or to check the variation of a period or an amplitude. In this case, the observers carry out observation in the following manner. That is, the observers visually extract a portion having a desired property from the entire waveform or from the waveform data in which the entire waveform has been zoomed in on several times. Then, the observers zoom in on the extracted portion manually to an extent that the zoomed portion is large enough to make the observers identify the details of the portion. In order to observe waveform data more easily, there are required measures for extracting a specified property from waveform data so as to facilitate identification of the details easily.

In consideration of these facts, an object of the present invention is to provide a waveform information display apparatus such as a digital oscilloscope as described above, in which the property of waveform data can be seen with ease and by the light of nature even if the details of the waveform are hard to observe directly due to compressed display.

In addition, another object of the invention is to provide a waveform information display apparatus in which the details of a waveform displayed in compression can be observed easily.

SUMMARY OF THE INVENTION

In order to solve the foregoing problems and achieve the foregoing objects, according to the invention, there is provided a waveform information display apparatus including:

an A/D converting unit for converting an analog input signal into digital waveform data;

a unit for storing said digital waveform data into a memory;

a unit for dividing said digital waveform data stored in said memory into a plurality of time segments, and generating compressed display data in each of said time segments so as to display a waveform on a screen;

a first operating unit for specifying a property to be observed upon a waveform of said analog input signal;

an arithmetic processing unit for extracting said property specified through said first operating unit, from said digital waveform data in each of said time segments, and carrying out arithmetic processing using the extracted property so as to obtain a value expressing the specified property in the time segment; and a display control unit for controlling a waveform display portion in each of the time segments to be displayed on the screen in accordance with the compressed display data in the time segments, so as to display the waveform display portion in a state in which the value expressing the property extracted by the arithmetic processing unit is reflected on the waveform display portion.

The specified property may have one or more values expressing the property in each time segment. Examples of such properties include pulse width of a positive pulse, pulse width of a negative pulse, a frequency, a period, duty ratio, rise time, and fall time.

In this case, according to the invention, the range where the value expressing the property is intended to be watched is set by a second operating unit. The set range is a range not larger than an upper limit value the user pays attention to (hereinafter referred to as "upper limit reference value"), a range not smaller than a lower limit value the user pays attention to (hereinafter referred to as "lower limit reference value"), or a range not smaller than the lower limit reference value and not larger than the upper limit reference value. Then, it is judged whether the value expressing the property extracted by the arithmetic processing unit is in the set range or not. The result of the judgment is reflected on the waveform display by the display control unit.

On the other hand, the property may have only one value expressing the property in each time segment. Examples of such properties include the number of pulses, a root mean square value, an average value, a maximum value, a minimum value, and the like. In this case, the value expressing the property extracted by the arithmetic processing unit is reflected on the waveform display by the display control unit.

Further, according to the invention, the arithmetic operating unit includes a unit for extracting a waveform portion having the specified property from each of the time segments, and a unit for storing an address position of the extracted waveform portion on the memory; and the waveform information display apparatus further includes a detail display unit for zooming in on waveform portions having values within the set range in the time segments in an order determined by the set range, in response to an instruction inputted through a third operating unit through which the instruction is inputted to observe details about the specified property.

In addition, the waveform information display apparatus according to the invention further includes a unit for displaying the compressed waveform using the compressed display data and the zoomed waveform on one and the same screen or different screens, and a unit for displaying to identify the position of a time segment including the zoomed waveform on the compressed waveform is carried out on the one and the same screen or one of the different screens.

According to the invention, the specified waveform property can be therefore grasped by the light of nature by only observing the waveform displayed on the screen. In addition, the waveform property the user wants to know can be grasped in more details and by the light of nature from the waveform displayed on the screen.

BRIEF DDESCRIPTION OF THE DRAWINGS

FIGS. 19 to 24 are tables used for explaining specific examples of the operation of the waveform information display apparatus according to the embodiment respectively;

FIGS. 25 to 27 are views showing display examples each schematically illustrating the state in which a specified property is reflected on a displayed waveform in the waveform information display apparatus according to the embodiment;

FIG. 28 is a table used for explaining a specific example of the operation of the waveform information display apparatus according to the embodiment;

FIG. 29 is a view showing an example in which a compressed waveform and a zoomed waveform are displayed in parallel in the waveform information display apparatus according to the embodiment;

FIG. 33 is an enlarged view of an example of a waveform using waveform data corresponding to the display portion of FIG. 32;

FIGS. 34 to 40 are tables used for explaining specific examples of the operation of the waveform information display apparatus according to the embodiment respectively;

FIGS. 41 to 44 are views showing display examples each schematically illustrating the state in which a specified property is reflected on a displayed waveform in the waveform information display apparatus according to the embodiment;

FIG. 45 is a table used for explaining a specific example of the operation of the waveform information display apparatus according to the embodiment; and FIG. 46 is a view showing a display example schematically illustrating the state in which a specified property is reflected on a displayed waveform in the waveform information display apparatus according to the embodiment.

Figure 1:
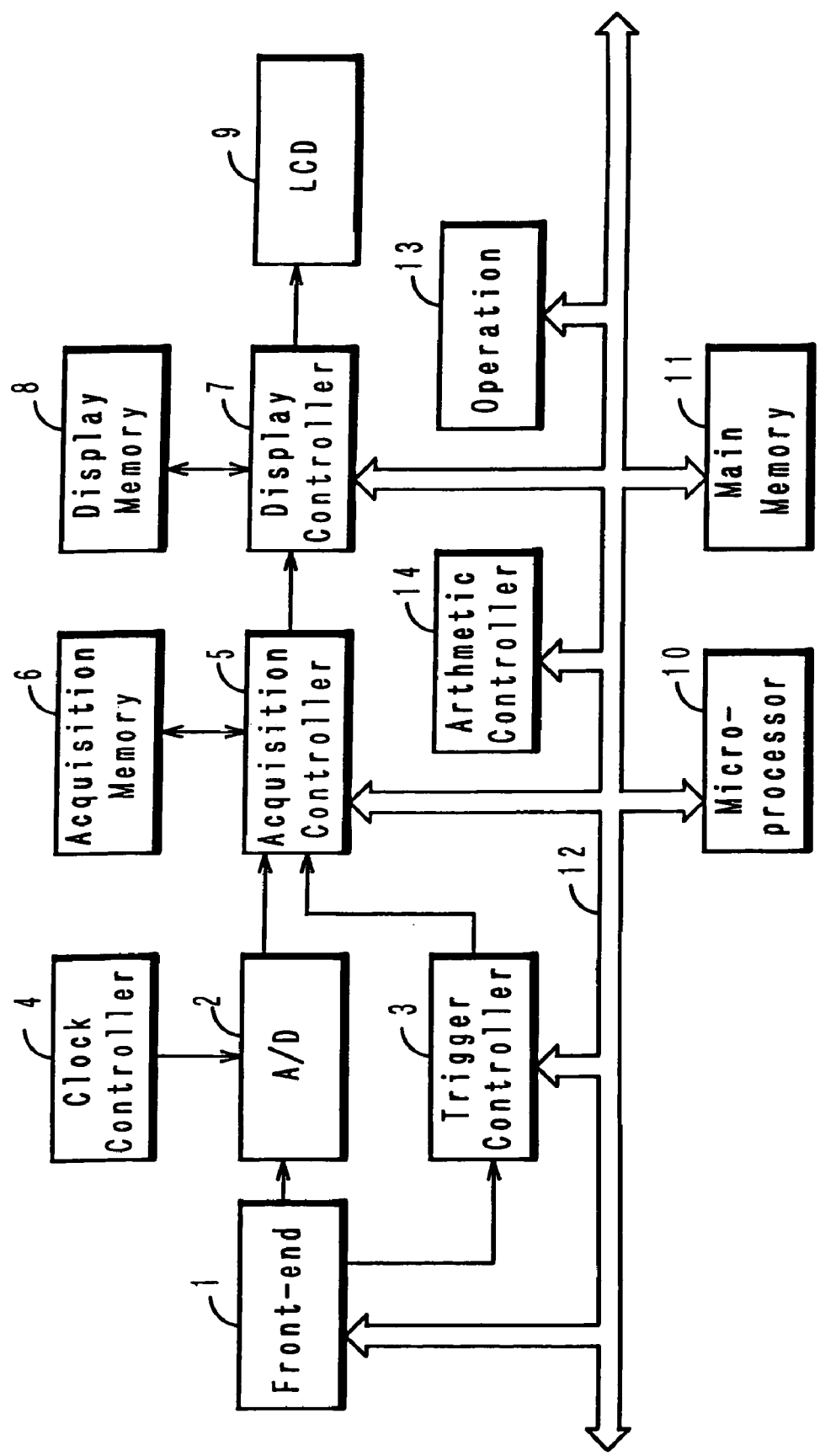
FIG. 1 is a block diagram of a waveform information display apparatus according to an embodiment of the invention.

In the drawings, the reference numeral 1 designates a front end portion; 2, an A/D (analog/digital) converter; 3, a trigger control portion; 4, a clock control portion; 5, an acquisition control portion; 6, an acquisition memory; 7, a display control portion; 8, a display memory; 9, an LCD; 10, a microprocessor; 11, a main memory; 12, a control bus; 13, an operating portion; and 14, an arithmetic processing portion.

DETAILED DESCRIPTION OF THE INVENTION

An embodiment of a method and an apparatus for displaying waveform information according to the invention will be described below with reference to the drawings.

FIG. 1 is a block diagram showing a configuration example of a digital oscilloscope as an embodiment of a waveform information display apparatus. In the digital oscilloscope according to this embodiment, control is made by a microprocessor (CPU) 10 in accordance with a program stored in a main memory 11. In FIG. 1, a control bus 12 is shown by the double lines.

An operating portion 13 has a button for specifying a waveform property to be observed, a zoom button (not shown), other operating buttons, and so on. Examples of such waveform properties to be observed include + pulse width, pulse width of a negative-direction pulse (hereinafter, referred to as "– pulse width"), a frequency, a period, duty ratio, rise time, fall time, the number of pulses, a root mean square value, an average value, a maximum value, a minimum value, a difference between the maximum value and the minimum value (peek-to-peek value (P—P value)), the frequency of occurrence of data in a specific section, and so on. The operating portion 13 outputs an operating signal in accordance with the user's operation using those operating buttons. The microprocessor 10 interprets the operating signal based on the operation of the operating buttons from the operating portion 13, judges what kind of operation has been carried out, and makes control in accordance with the result of the judgement.

A front end portion 1 is constituted by an attenuator, a vertical amplifier, a trigger amplifier, and so on. The front end portion 1 carries out processing such as amplification of an analog waveform signal supplied from a not-shown probe or the like, in accordance with the control from the microprocessor 10. The analog waveform signal processed by the front end portion 1 is supplied to an A/D converter 2 and a trigger control portion 3.

In the A/D converter 2, the analog waveform signal from the front end portion 1 is converted into digital waveform data in accordance with a sampling clock from a clock control portion 4. In the digital oscilloscope according to this embodiment, the sampling rate in the A/D converter 2 is variable, and the clock control portion 4 controls the frequency of the sampling clock supplied therefrom in accordance with a control signal from the microprocessor 10.

The microprocessor 10 determines the sampling rate in accordance with the setting through the operating portion 13, and controls the clock control portion 4 so as to attain the determined sampling rate. The digital waveform data from the A/D converter 2 is supplied to an acquisition control portion 5.

Incidentally, in stead of making the sampling rate in the A/D converter 2 variable, the sampling rate in the A/D converter 2 may be fixed while data is thinned down in the acquisition control portion 5. In this case, similar processing can be carried out by changing the rate of the thinning.

The trigger control portion 3 processes the signal from the front end portion 1 in accordance with the control of the microprocessor 10, and supplies a trigger signal to the acquisition control portion 5.

In response to a control signal from the microprocessor 10, the acquisition control portion 5 stores the digital waveform data from the A/D converter 2 into an acquisition memory 6 constituting a waveform memory, with reference to the trigger signal from the trigger control portion 3. In addition, in response to a control portion from the microprocessor 10, the acquisition control portion 5 reads out the digital waveform data stored in the acquisition memory 6, and sends the digital waveform data to a display control portion 7.

In accordance with the control of the microprocessor 10, the display control portion 7 converts the waveform data transferred from the acquisition control portion 5, into display data for displaying a waveform on the screen of a liquid crystal display (hereinafter, referred to as "LCD") 9 as an example of a display component. The converted display data is stored into a display memory 8. Then, the stored display data is read out and sent to the LCD 9 so that a waveform is displayed on the screen thereof.

Incidentally, the display control unit in claims is not constituted by only this display control portion 7, but is constituted by the microprocessor 10, the display control portion 7, the main memory 11, and software processing. Similarly, the detail display unit in claims is constituted by the microprocessor 10, the display control portion 7, the main memory 11, and softer processing.

In this case, the display resolving power of the LCD 9 in the horizontal direction corresponding to the time axis direction is low in comparison with the volume of waveform data of the acquisition memory 6, and the display resolving power is about 1,000 points at most. Accordingly, if waveform data captured in the memory were used directly, the entire waveform or even a partial waveform using the waveform data captured in the memory could not be displayed.

Therefore, as described in the prior art, the time length of the waveform data captured in the acquisition memory 6 is divided into split segments whose number is matched with the display resolving power, and each split time segment (hereinafter, simply referred to as "time segment") is allocated to one horizontal point of the LCD 9. Thus, a display area per time segment corresponds to a vertical line of pixels on the screen as one horizontal point.

Accordingly, in the display control portion 7, compressed display data for waveform display of each time segment is generated from a plurality of pieces of waveform data in the time segment by use of a vertical line of pixel data on the screen in accordance with the control of the microprocessor 10. In this embodiment, this compressed display data is designed as follows.

Figure 16:
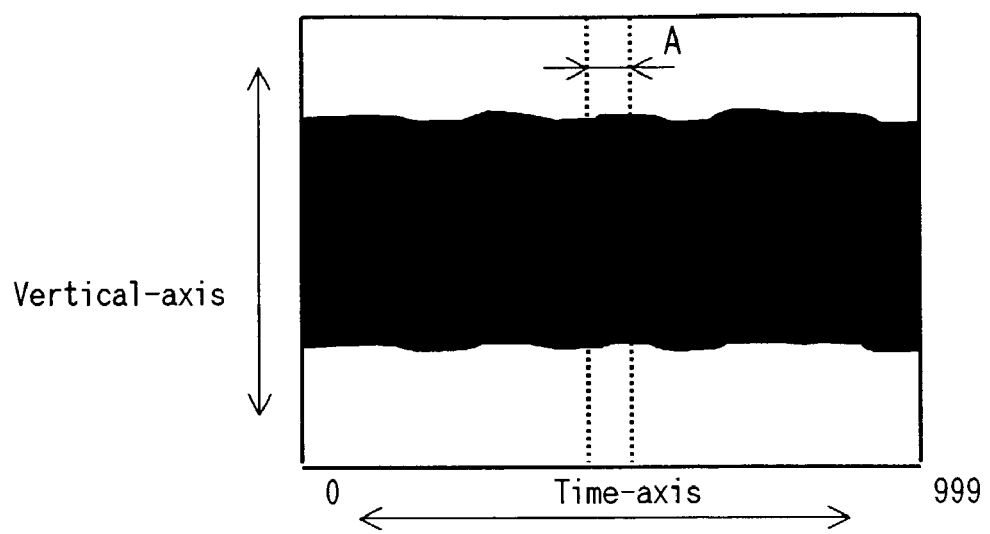
FIG. 16 is a view showing a display example of a compressed waveform in the waveform information display apparatus according to the embodiment.

That is, a maximum value and a minimum value are detected from waveform data in each time segment. Display data of display pixels corresponding to the detected maximum and minimum values are set to be displayed in predetermined brightness or color while display data of all the display pixels in the vertical direction between the maximum value and the minimum value are also set to be displayed in the same brightness or color. FIG. 16 which will be described later shows a display example of an entire waveform based on such compressed display data.

In addition, the digital oscilloscope according to this embodiment has an arithmetic processing portion 14. This arithmetic processing portion 14 is a portion where arithmetic circuits for extracting properties the user can specify through the operating portion 13, such as a detector for + pulse width, a detector for − pulse width, a detector for a period, a detector for a frequency, and a detector for duty ratio, are provided as hardware.

Incidentally, all the detectors for the properties specified through the operating portion 13 may be constituted by hardware, but not to say, they may be constituted by the processings of software using the microprocessor 10. In this embodiment, in consideration of the detection rate, the hardware scale, and so on, the detectors for the specified properties are constituted by both hardware and software.

Some examples of methods for extracting the specified properties by the arithmetic processing portion 14 or software using the microprocessor 10 will be described.

Figure 2:
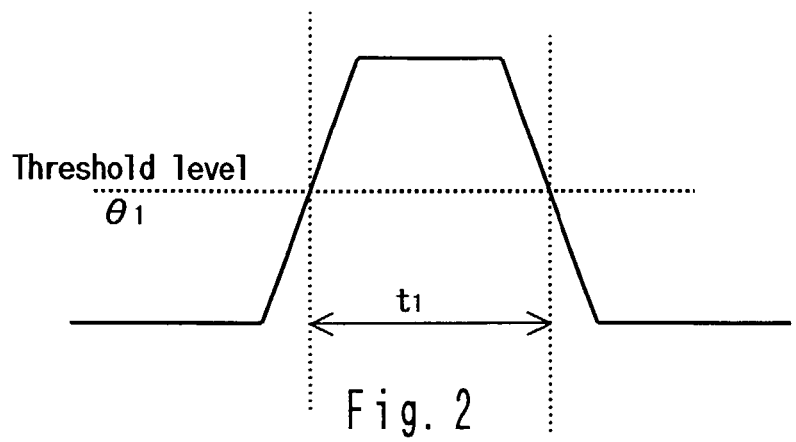
FIGS. 2 to 7 are graphs showing examples of methods for extracting specified properties in the embodiment respectively.

FIG. 2 is a graph for explaining the operation of the detector for + pulse width. This detector for + pulse width regards a waveform data portion having a higher level than a specified threshold level θ1 as a + pulse, and calculates the position of the waveform data portion on the acquisition memory 6 and the pulse width thereof. That is, time length t1 between a time point when the threshold level θ1 is crossed from the lower level to the higher level (a time point when the rise edge of the + pulse crosses the threshold level θ1) and a time point when the threshold level θ1 is crossed from the higher level to the lower level (a time point when the fall edge of the + pulse crosses the threshold level θ1) is detected as the pulse width of the + pulse, that is, the + pulse width.

Then, in this embodiment, the detector for the + pulse width detects the address position of the waveform data, as the start address where the + pulse waveform is stored, on the acquisition memory 6 at the time point when the rise edge of the + pulse crosses the threshold level θ1.

Incidentally, as is apparent from FIG. 2, the waveform with the property does not start from the position of this start address where the waveform is stored. However, at the time of displaying a zoomed waveform of a waveform portion with the property, which will be described later, waveform data is read from an address position predetermined time earlier than this start address where the waveform is stored. Since the waveform portion is displayed thus, there is no fear that the displayed waveform comes short. The same things will be applied to the method for extracting any other property.

Figure 3:
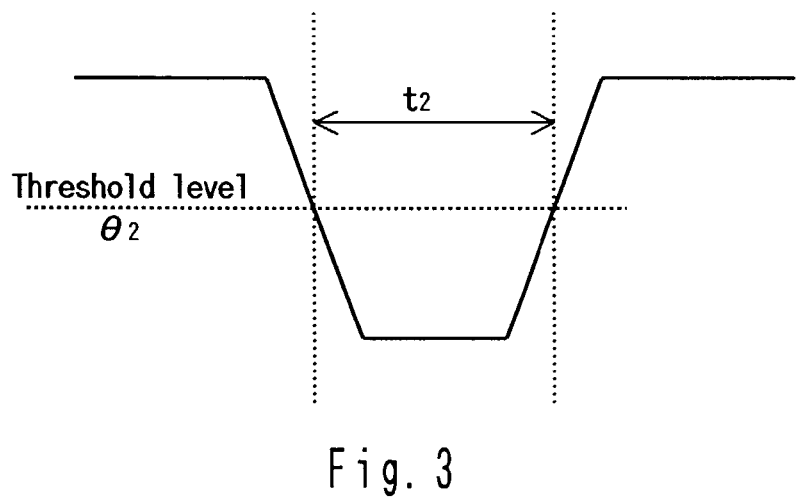

FIG. 3 is a graph for explaining the operation of the detector for − pulse width. This detector for − pulse width regards a waveform data portion having a lower level than a specified threshold level θ2 as a − pulse, and detects the position of the waveform data portion on the acquisition memory 6 and the pulse width thereof. That is, time length t2 between a time point when the threshold level θ2 is crossed from the higher level to the lower level (a time point when the fall edge of the − pulse crosses the threshold level θ2) and a time point when the threshold level θ2 is crossed from the lower level to the higher level (a time point when the rise edge of the − pulse crosses the threshold level θ2) is detected as the pulse width of the − pulse, that is, the − pulse width.

Then, in this embodiment, the detector for the − pulse width detects the address of the waveform data, as the start address where the − pulse waveform is stored, on the acquisition memory 6 at the time point when the fall edge of the − pulse crosses the threshold level θ2.

Figure 4:
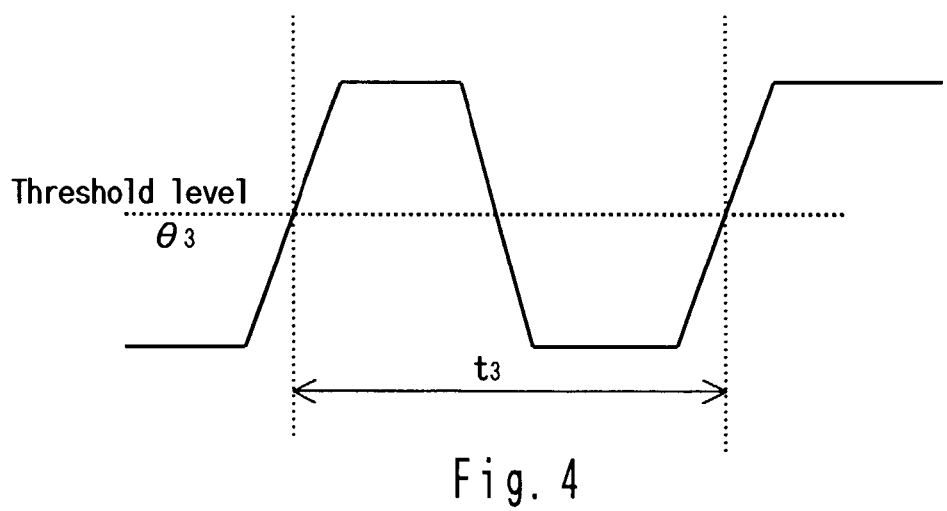

FIG. 4 is a graph for explaining the operation of the detector for a period. This detector for a period detects the position (address on the acquisition memory 6) of waveform data forming a periodic signal crossing a specified threshold level θ3, and a value t3 of the period thereof. In the example of FIG. 4, the period between time points when the rise edge crosses the threshold level θ3 is detected as the value t3 of the period. Then, the address of the waveform data on the acquisition memory 6 at the time point when the rise edge of the periodic signal crosses the threshold level θ3 for the first time is detected as the start address where the periodic signal waveform is stored. Incidentally, the frequency is detected as the reciprocal of the period detected by this period detector.

Figure 5:
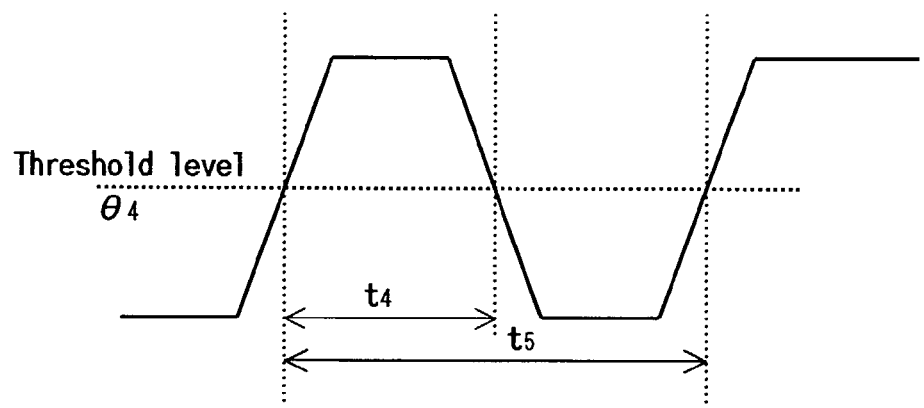

FIG. 5 is a graph for explaining the operation of the detector for duty. This detector for duty detects the position of waveform data forming a periodic signal crossing a specified threshold level θ4, and a value t4/t5 of the duty thereof. That is, in the example of FIG. 5, the period between time points when the rise edge crosses the threshold level θ4 is detected as a value t5 of the period while time length t4 between a time point when the rise edge crosses the threshold level θ4 and a time point when the fall edge crosses the threshold level θ4 is detected. Thus, the value of the duty is detected as t4/t5×100[%].

Then, the address of the waveform data on the acquisition memory 6 at the time point when the rise edge crosses the threshold level θ4 for the first time is detected as the start address where the signal waveform with the duty value is stored.

Figure 6:
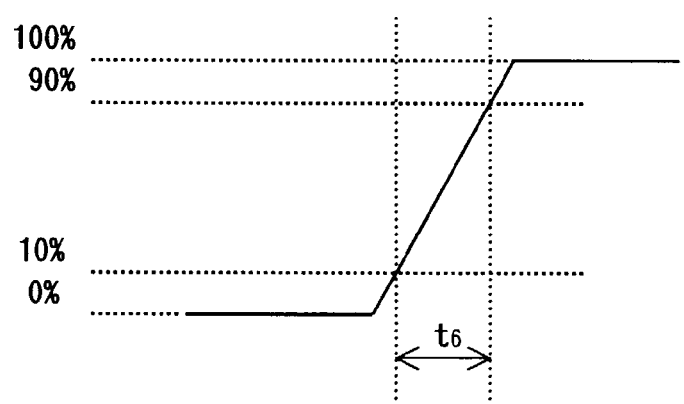

FIG. 6 is a graph for explaining the detector for rise time. This detector for rise time obtains the position (address on the acquisition memory 6) of a waveform data portion forming a rise signal crossing a specified segment, and a value of the rise time. That is, as shown in FIG. 6, a period t6 between a time point of 10% rise from the start (0%) of the rise and a time point of 90% rise is obtained as the rise time. Then, the address of the waveform data on the acquisition memory 6 at the time point of 10% rise from the rise start (0%) is detected as the start address where the signal waveform with the value of rise time is stored.

Figure 7:
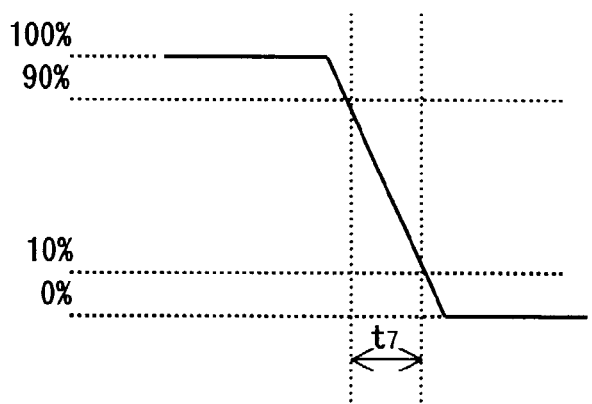

FIG. 7 is a graph for explaining the detector for fall time. This detector for fall time obtains the position (address on the acquisition memory 6) of a waveform data portion forming a fall signal crossing a specified section, and the value of the rise time. That is, as shown in FIG. 7, a period t7 between a time point of fall to 90% from the fall start (100%) and a time point of fall to 10% is obtained as the fall time. Then, the address of the waveform data on the acquisition memory 6 at the time point of fall to 90% from the fall start (100%) is detected as the start address where the signal waveform with the value of fall time is stored.

A main waveform information display operation in the digital oscilloscope as the waveform information display apparatus configured thus according to this embodiment will be described with reference to the flow charts shown in FIGS. 8 to 15. The operation in these flowcharts includes the software operation carried out by the microprocessor 10 and the processings in a part of the arithmetic processing portion 14.

Incidentally, as the method in which a property specified through the operating portion 13 is reflected on each time segment of the entire compressed waveform, there are some methods such as a method using a variation in the brightness value of pixels, a method using a variation in the color of pixels, a method using a variation in the display density of pixels, and a method in which one selected from a plurality of identifying marks prepared in advance is added. In the example which will be described later, as the method in which a specified property is reflected on each time segment of the entire compressed waveform, the brightness value of pixels in a vertical line corresponding to the time segment is varied in accordance with the value expressing the property.

Figure 8:
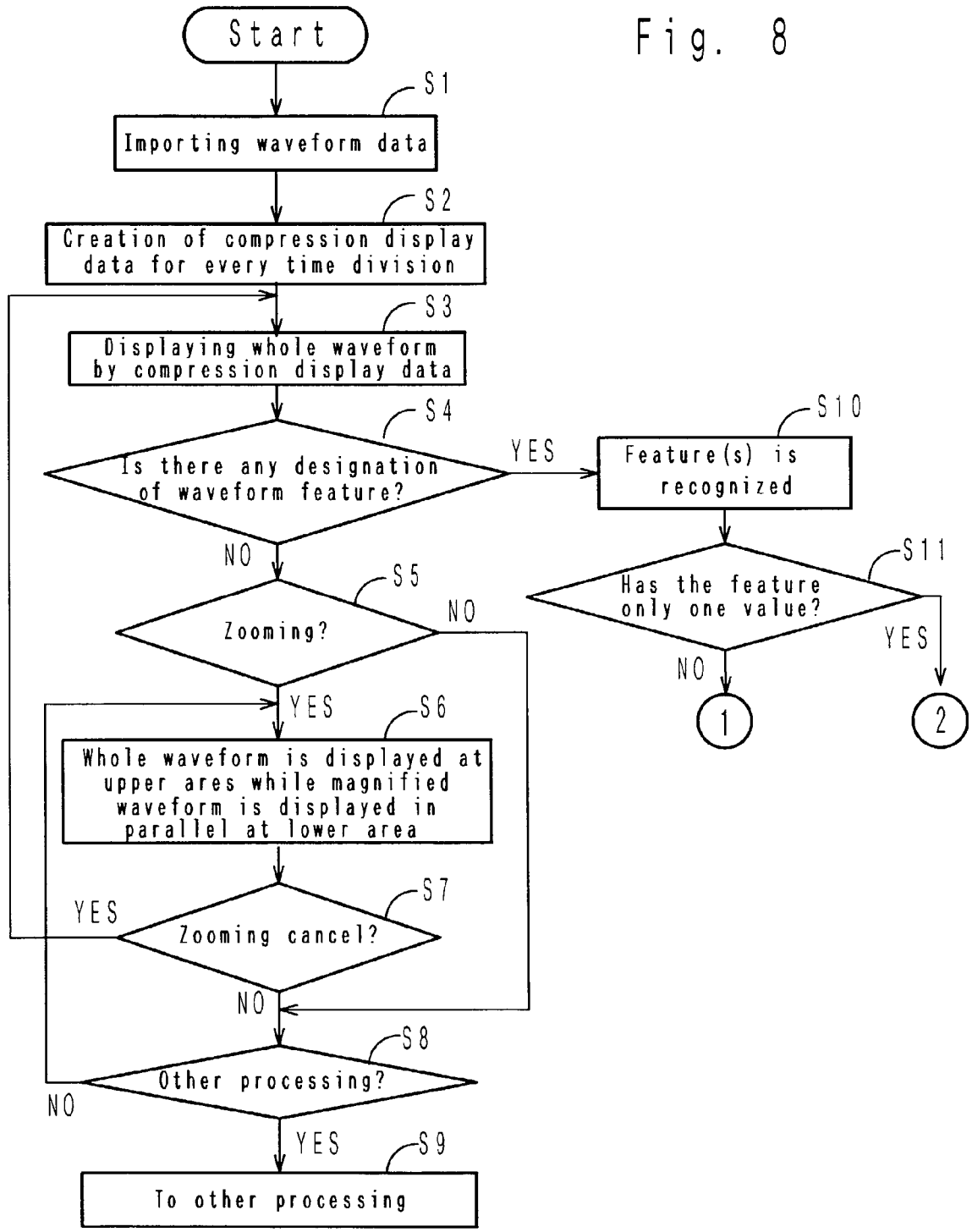
FIGS. 8 to 15 are partial flow charts for explaining the operation of the waveform information display apparatus according to the embodiment respectively.

When the operating button of the operating portion 13 is pressed by a user (observer) so that an operation to capture a waveform and an instruction to start the capture are given, the flow chart of FIG. 8 starts to capture waveform data (Step S1). That is, the microprocessor 10 determines the sampling rate, makes the A/D converter 2 convert analog waveform data from the front end portion 1 into digital waveform data at the determined sampling rate, and stores the digital waveform data into the acquisition memory 6 through the acquisition control portion 5.

Next, on the basis of the waveform data stored in the acquisition memory 6, compressed display data for each time segment is generated as described previously (Step S2). Then, on the basis of the compressed display data, the entire captured waveform is displayed in compression on the screen of the LCD 9 (Step S3).

In the state where this entire compressed waveform is displayed, it is judged whether a property of the waveform to be observed has been specified through the operation of the operating button in the operating portion 13 by the user or not (Step S4). When it is concluded that no property of the waveform to be observed has been specified, it is judged whether an instruction to zoom in on a specified section of the entire compressed waveform has been given from the operating portion 13 or not (Step S5).

When there is an instruction to zoom in on a specified section, the entire compressed waveform is displayed on the upper side of the screen of the LCD 9 while a waveform of the specified section is zoomed in on in accordance with the specified zoom ratio under and in parallel with the entire compressed waveform (Step S6). Here, the zoomed waveform is displayed by using the waveform data in the acquisition memory 6 directly or displayed by thinning the waveform data in accordance with the zoom ratio. The same method of displaying the zoomed waveform will be applied to the following description.

Next, it is judged whether an instruction to release the zoom in has been given by the operation of the operating button of the operating portion 13 or not (Step S7). When it is concluded that the instruction to release has been given, the routine of processing returns to Step S3, returning to the screen displaying the entire compressed waveform using the compressed display data.

When the instruction to release the zoom in has not been given, it is judged whether an instruction for another processing has been given or not (Step S8). When it is concluded that no instruction for another processing has been given, the routine of processing returns to Step 6, keeping on with the zoom display screen. When it is concluded in Step 8 that an instruction for another processing has been given through the operating portion 13, the routine of processing shifts to a routine for processing of the given instruction (Step S9).

On the other hand, when it is concluded in Step S4 that a waveform property to be observed has been specified, what property has been specified is recognized (Step S10). Then, it is judged whether the specified property belongs to a category in which there is only one value expressing the property in each time segment, or not (Step S11).

Here, when the property specified by the operating portion 13 is + pulse width, − pulse width, a frequency, a period, duty ratio, rise time, or fall time by way of example, there is a possibility that a plurality of values expressing the specified property are present in each time segment. On the other hand, when the specified property is the number of pulses, a root mean square value, an average value, a maximum value, a minimum value, a value of difference between the maximum value and the minimum value, or the frequency of occurrence of data in a specified section by way of example, there is only one value expressing the property in each time segment.

Figure 9:
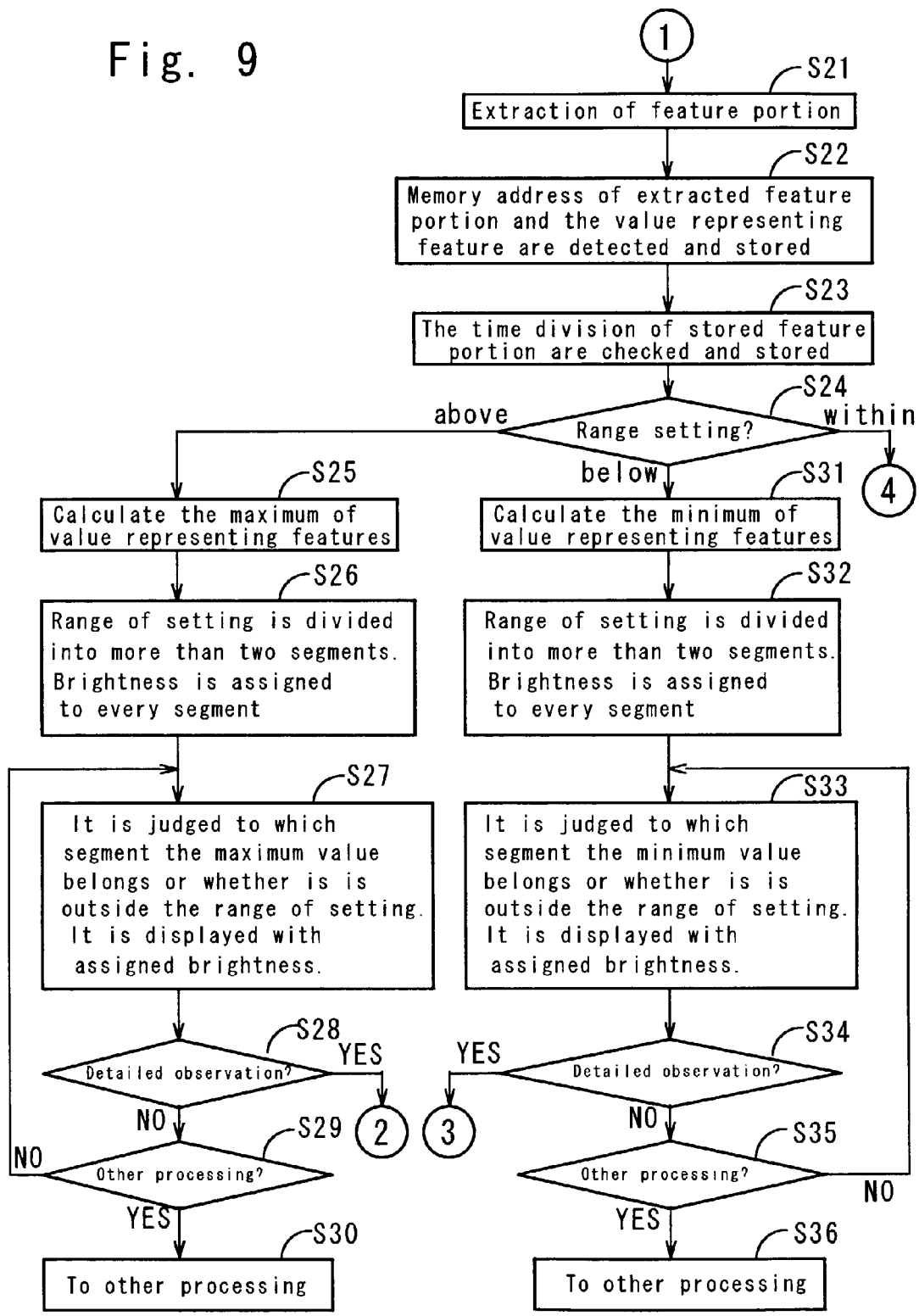

When it is concluded in Step S11 that the specified property belongs to a category in which there is a possibility that a plurality of values expressing the property are present in each time segment, the portions having the property are extracted in the method by the arithmetic processing portion 14 or the software arithmetic processing carried out by the microprocessor 10 (Step S21 in FIG. 9).

Then, the addresses of the extracted property portions on the acquisition memory 6 (the start addresses where the waveform is stored) are detected while the values expressing the property are calculated, and the addresses and the values expressing the property are stored in the main memory 11

(Step S22). In addition, in which time segments the stored property portions are contained respectively is detected, and the detection result is also stored in the main memory 11 (Step S23).

Next, the range set for the specified property and inputted through the operating portion 13 by the operation of the user is judged (Step S24). When it is concluded that the set range is "not smaller than the lower limit reference value", the maximum value of the values expressing the specified property is calculated in each time segment, and the calculated maximum value is stored in the main memory 11 as a value expressing the specified property for the time segment (Step S25).

Next, the set range is divided into a plurality of split ranges, and the way to reflect in each split range and the way to reflect in a range out of the set range are determined. In this example, as for the way to reflect, a variation in brightness value is used as described previously. Therefore, different brightness values from one another are assigned to the respective split ranges, and further a brightness value different from those assigned brightness values is evenly assigned to the range out of the set range (Step S26).

Next, it is judged to which split range determined in Step 26 the maximum value calculated for each time segment in Step S25 belongs, or whether the maximum value does not belong to any split range but is out of the set range. Then, the brightness value assigned to the judged range is identified. Then, the pixel value of the display portion based on the compressed display data in each time segment (the vertical portion at the horizontal point corresponding to each time segment) in the entire compressed waveform displayed on the screen of the LCD 9 is displayed with the identified brightness value (Step S27).

In such a manner, in the entire compressed waveform displayed on the screen of the LCD 9, the value expressing the specified property is reflected on each time segment. Thus, the user can observe the specified property roughly and by the light of nature from the displayed entire compressed waveform. Then, in this embodiment, when an instruction to display the details of the entire compressed waveform is given by the operation of the operating button in the operation portion 13, the further details about the specified property can be displayed automatically.

In this case, according to this embodiment, the further details about the specified property can be displayed automatically if the user gives an instruction to observe the details. Further, when a time segment to be observed is specified from the entire compressed waveform, the details of only the time segment can be observed.

That is, the microprocessor 10 judges whether the instruction to observe the details has been given through the operating portion 13 by the user on the display screen in Step S27 or not (Step S28). When it is concluded that no instruction to observe the details has been given, it is judged whether an instruction for another processing has been given or not (Step S29). When it is concluded that no instruction for another processing has been given, the routine of processing returns to Step S27, keeping on with the display screen of the entire compressed waveform in which the value expressing the property has been reflected on the waveform portion in each time segment. When it is concluded in Step S29 that an instruction for another processing has been given, the routine of processing shifts to a routine for processing of the given instruction (Step S30).

Figure 10:
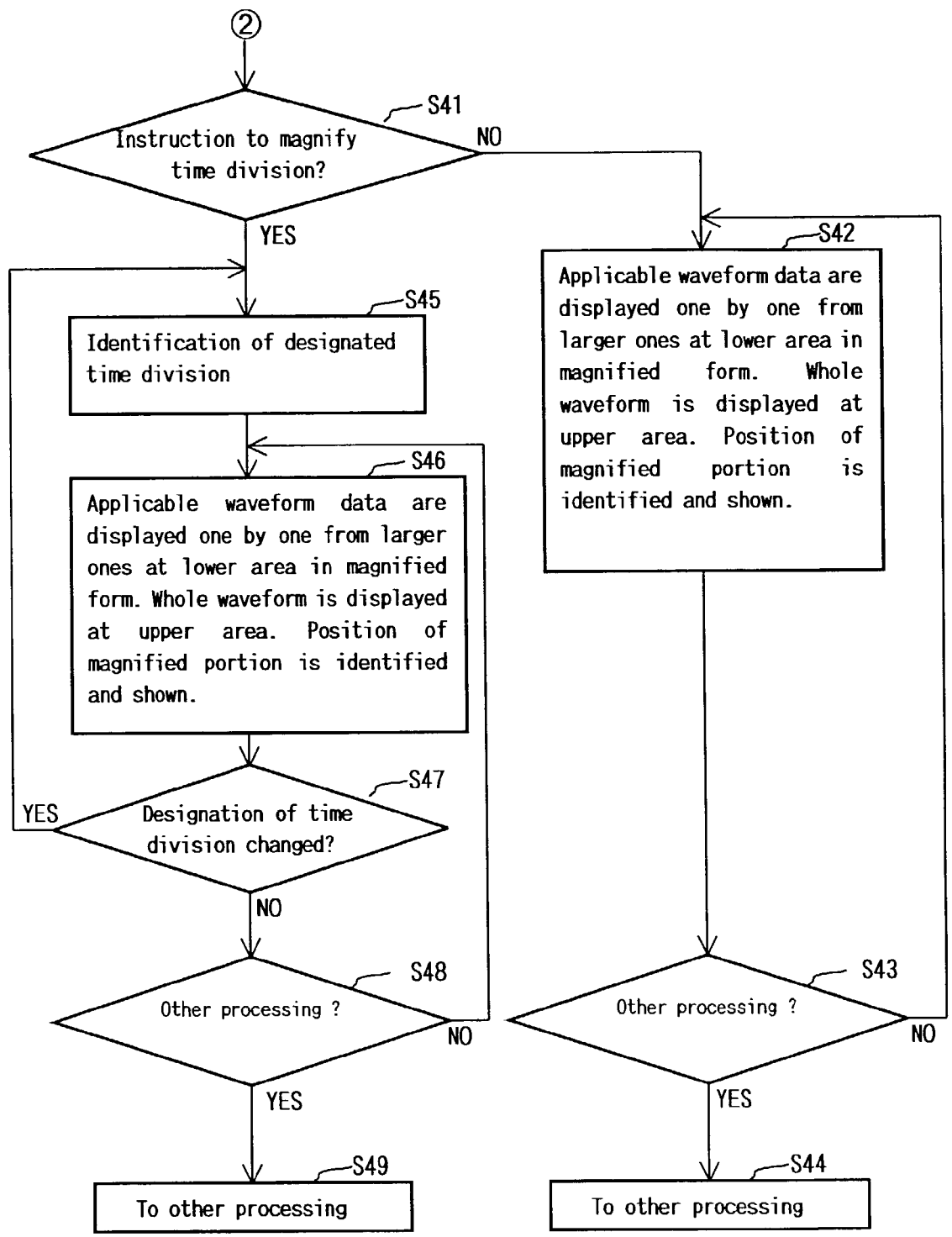

On the other hand, when it is concluded in Step S28 that the instruction to observe the details has been given, the routine of processing is followed by the routine of FIG. 10.

Then, it is judged whether a time segment to be zoomed in on has been specified on the whole screen by the user or not (Step S41 in FIG. 10).

When it is concluded that no time segment has been specified through the operating portion 13, of all the time segments, a waveform portion is selected from waveform portions having the specified property suited to the set range sequentially in the order of a decreasing value expressing the specified property, and the selected waveform portion is zoomed in on and displayed on the lower side of the screen of the LCD 9 (Step S42). At this time, the entire compressed waveform is continuously displayed on the upper side of the screen of the LCD 9 while identifying which portion the zoomed time segment belongs to.

At the time of the display in Step S42, the zoomed portion is switched sequentially automatically in response to a user's instruction to "zoom in on the next waveform". Incidentally, the zoomed portion may be switched sequentially automatically whenever a fixed time has been passed.

Next, it is judged whether an instruction for another processing has been given through the operating portion 13 (Step S43). When it is concluded that no instruction for another processing has been given, the routine of processing returns to Step S42, keeping on with the parallel display screen of the entire compressed waveform and the zoomed waveform. When it is concluded in Step S43 that an instruction for another processing has been given, the routine of processing shifts to a routine for processing of the given instruction (Step S44).

On the other hand, when it is concluded in Step S41 that an instruction to specify a time segment to be zoomed in on has been given by the user, the specified time segment is identified (Step S45). Then, of the specified time segment, a waveform portion is selected from waveform portions having the specified property suited to the set range sequentially in the order of a decreasing value expressing the specified property, and the selected waveform portion is zoomed in on and displayed on the lower side of the screen of the LCD 9 (Step S46). At this time, the entire compressed waveform is continuously displayed on the upper side of the screen of the LCD 9 while identifying which portion the zoomed time segment belongs to.

Also in this case, the zoomed portion may be switched sequentially automatically in response to a user s instruction to "zoom in on the next waveform" through the operating portion 13, or may be switched sequentially automatically whenever a fixed time has been passed.

Next, it is judged whether the time segment specified to be zoomed in on has been changed on the entire compressed waveform by the user or not (Step S47). When it is concluded that the specified time segment has been changed, the routine of processing returns to Step S45, so that the time segment is identified, a waveform portion is selected from waveform portions having the specified property suited to the set range in the identified time segment sequentially in the order of a decreasing value expressing the specified property, and the selected waveform portion is zoomed in on and displayed on the lower side of the screen of the LCD 9 (Step S46).

When it is concluded in Step S47 that the specified time segment has not been changed, it is judged whether an instruction for another processing has been given or not (Step S48). When it is concluded that no instruction for another processing has been given, the routine of processing returns to Step S46, keeping on with the parallel display screen of the entire compressed waveform and the zoomed waveform. When it is concluded in Step S48 that an instruction for another processing has been given, the routine of processing shifts to a routine for processing of the given instruction (Step S49).

On the other hand, when it is concluded in Step S24 that the set range is "not larger than the upper limit value", the minimum value of the values expressing the specified property is calculated in each time segment, and the calculated minimum value is stored in the main memory 11 as a value expressing the specified property for the time segment (Step S31 in FIG. 9).

Next, the set range is divided into a plurality of split ranges, and the way to reflect in each split range and the way to reflect in a range out of the set range are determined. In this example, as for the way to reflect, a variation in brightness value is used as described previously. Therefore, different brightness values from one another are assigned to the respective split ranges, and further a brightness value different from those assigned brightness values is evenly assigned to any range out of the set range (Step S32).

Next, it is judged to which split range determined in Step S32 the minimum value calculated for each time segment in Step S31 belongs, or whether the minimum value does not belong to any split range but is out of the set range. Then, the brightness value assigned to the judged range is identified. Then, the pixel value of the waveform display portion based on the compressed display data in each time segment (the vertical portion at the horizontal point corresponding to each time segment) in the entire compressed waveform displayed on the screen of the LCD 9 is displayed with the identified brightness value (Step S33).

Then, in such a manner, on the display screen of the entire compressed waveform on which the value expressing the specified property is reflected in each time segment, it is judged whether an instruction to observe the details has been given through the operating portion 13 by the user or not (Step S34). When it is concluded that no instruction to observe the details has been given, it is judged whether an instruction for another processing has been given or not (Step S35). When it is concluded that no instruction for another processing has been given, the routine of processing returns to Step S33, keeping on with the display screen of the entire compressed waveform in which the value expressing the property has been reflected on the waveform portion in each time segment. When it is concluded in Step S35 that an instruction for another processing has been given, the routine of processing shifts to a routine for processing of the given instruction (Step S36).

Figure 11:
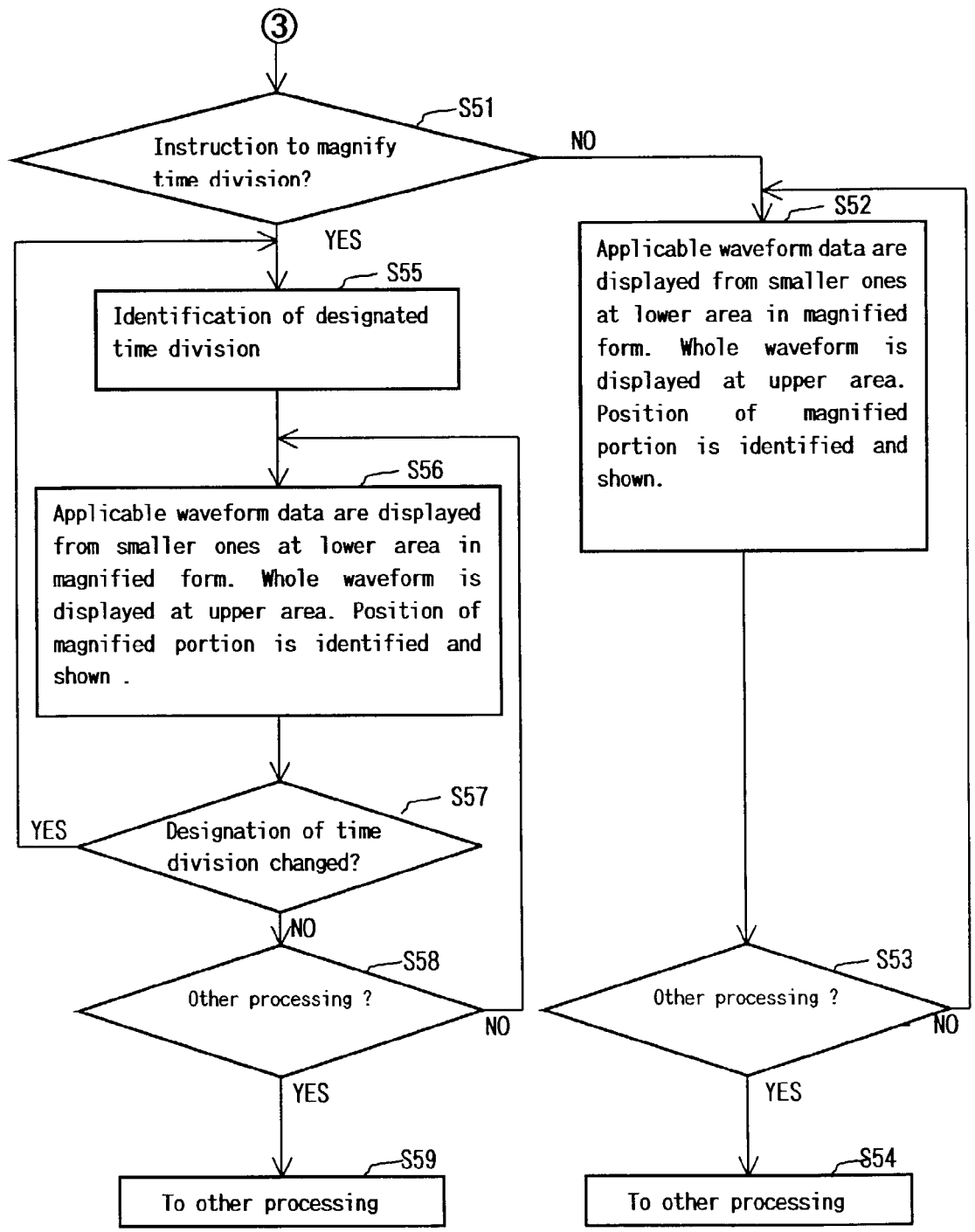
Figure 12:
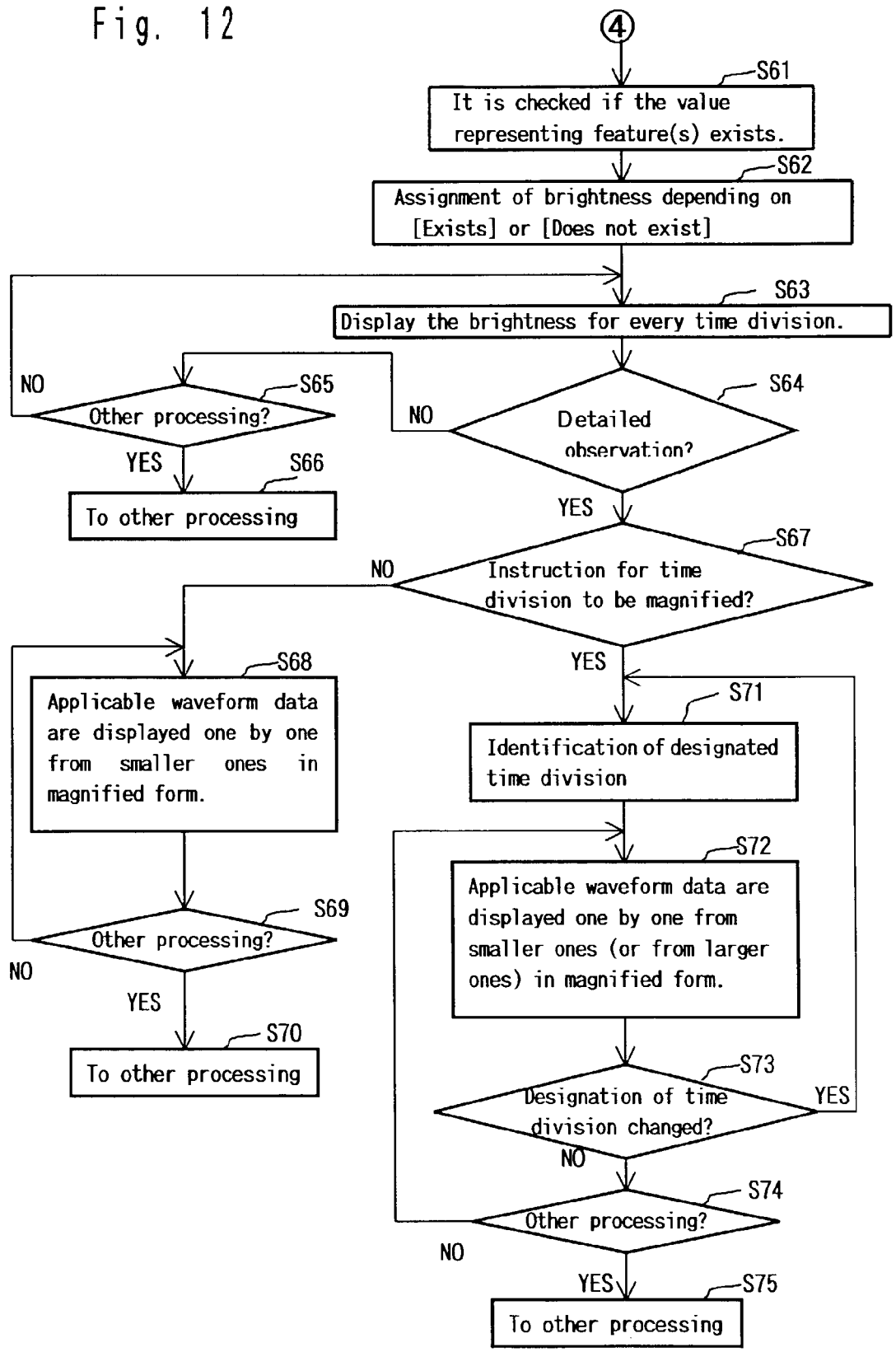

On the other hand, when it is concluded in Step S34 that the instruction to observe the details has been given through the operating portion 13, the routine of processing is followed by the routine of FIG. 11. Then, it is judged whether a time segment to be zoomed in on has been specified on the displayed entire compressed waveform by the user or not (Step S51 in FIG. 11).

On the contrary, when it is concluded that no time segment has been specified through the operating portion 13, of all the time segments, a waveform portion is selected from waveform portions having the specified property suited to the set range sequentially in the order of an increasing value expressing the specified property, and the selected waveform portion is zoomed in on and displayed on the lower side of the screen of the LCD 9 (Step S52). At this time, the entire compressed waveform is continuously displayed on the upper side of the screen of the LCD 9 while identifying which portion the zoomed time segment belongs to.

Incidentally, at the time of the display in Step S52, the zoomed portion may be switched sequentially automatically in response to a user's instruction to "zoom in on the next waveform", or may be switched sequentially automatically whenever a fixed time has been passed.

Next, it is judged whether an instruction for another processing has been given (Step S53). When it is concluded that no instruction for another processing has been given, the routine of processing returns to Step S52, keeping on with the parallel display screen of the entire compressed waveform and the zoomed waveform. When it is concluded in Step S53 that an instruction for another processing has been given, the routine of processing shifts to a routine for processing of the given instruction (Step S54).

On the other hand, when it is concluded in Step S51 that an instruction to specify a time segment to be zoomed in on has been given by the user, the specified time segment is identified (Step S55). Then, of the specified time segment, a waveform portion is selected from waveform portions having the specified property suited to the set range sequentially in the order of an increasing value expressing the specified property, and the selected waveform portion is zoomed in on and displayed on the lower side of the screen of the LCD 9 (Step S56). At this time, the entire compressed waveform is continuously displayed on the upper side of the screen of the LCD 9 while identifying which portion the zoomed time segment belongs to.

Also in this case, the zoomed portion may be switched sequentially automatically in response to a user's instruction to "zoom in on the next waveform", or may be switched sequentially automatically whenever a fixed time has been passed.

Next, it is judged whether the time segment specified to be zoomed in on has been changed on the entire compressed waveform by the user or not (Step S57). When it is concluded that the specified time segment has been changed, the routine of processing returns to Step S55, so that the changed time segment is identified, a waveform portion is selected from waveform portions having the specified property suited to the set range in the time segment sequentially in the order of an increasing value expressing the specified property, and the selected waveform portion is zoomed in on and displayed on the lower side of the screen of the LCD 9 (Step S56).

When it is concluded in Step S57 that the specified time segment has not been changed, it is judged whether an instruction for another processing has been given or not (Step S58). When it is concluded that no instruction for another processing has been given, the routine of processing returns to Step S56, keeping on with the parallel display screen of the entire compressed waveform and the zoomed waveform. When it is concluded in Step S58 that an instruction for another processing has been given, the routine of processing shifts to a routine for processing of the given instruction (Step S59).

On the other hand, when it is concluded in Step S24 that the set range is a specific range section set to be "not smaller than the lower limit reference value and not larger than the upper limit value", it is judged whether the value expressing the specified property in each time segment is a value within the set specific range section or not. That is, it is detected whether a value expressing the specified property suited to the set range exists in each time segment or not. The presence/absence of the value expressing the specified property suited to the set range is set at a value expressing the specified property for each time segment, and the presence/ absence of the specified property in the time segment is stored in the main memory 11 (Step S61 in FIG. 12).

Next, as for the way to reflect "presence" and "absence" of the value expressing the specified property suited to the set range in this example, different brightness values from each other are assigned (Step S62). Then, the pixel value of the waveform display portion based on the compressed display data in each time segment of the entire compressed waveform displayed on the screen of the LCD 9 is displayed with the brightness value corresponding to "presence" or "absence" of the value expressing the specified property in the time segment (Step S63).

Incidentally, the following manner maybe adopted. That is, for each time segment in which the value expressing the specified property suited to the set range is "present", the value expressing the property is also stored in the main memory 11. The set range is divided into a plurality of split ranges, and a brightness value is determined for each split range. In accordance with which split range the value expressing the property and stored in the main memory 11 belongs to, the display brightness value for the time segment is determined. In this case, a value different from the brightness values assigned to the time segments in each of which the value expressing the specified property suited to the set range is "present" is evenly assigned to each time segment in which the value expressing the specified property suited to the set range is "absent".

Then, in such a manner, on the display screen of the entire compressed waveform on which the value expressing the specified property is reflected on each time segment, it is judged whether an instruction to observe the details has been given through the operating portion 13 by the user or not (Step S64). When it is concluded that no instruction to observe the details has been given, it is judged whether an instruction for another processing has been given or not (Step S65). When it is concluded that no instruction for another processing has been given, the routine of processing returns to Step S63, keeping on with the display screen of the entire compressed waveform in which the value expressing the property has been reflected on the waveform portion in each time segment. When it is concluded in Step S65 that an instruction for another processing has been given, the routine of processing shifts to a routine for processing of the given instruction (Step S66).

On the other hand, when it is concluded in Step S64 that the instruction to observe the details has been given through the operating portion 13, it is judged whether the time segment to be zoomed in on has been specified on the display screen of the entire compressed waveform by the user or not (Step S67).

When it is concluded that no time segment has been specified through the operating portion 13, of all the time segments, a waveform portion is selected from waveform portions having the specified property suited to the set range sequentially in the order of an increasing value expressing the specified property, and the selected waveform portion is zoomed in on and displayed on the lower side of the screen of the LCD 9 (Step S68). At this time, the entire compressed waveform is continuously displayed on the upper side of the screen of the LCD 9 while identifying which portion the zoomed time segment belongs to.

Incidentally, in Step S68, setting may be done as follows. That is, of all the time segments, a waveform portion is selected from waveform portions having the specified property suited to the set range sequentially in the order of a decreasing value expressing the specified property, and the selected waveform portion is zoomed in on and displayed on the lower side of the screen of the LCD 9.

Further, at the time of the display in Step S68, the zoomed portion may be switched sequentially automatically in response to a user's instruction to "zoom in on the next waveform", or may be switched sequentially automatically whenever a fixed time has been passed.

Next, it is judged whether an instruction for another processing has been given (Step S69). When it is concluded that no instruction for another processing has been given, the routine of processing returns to Step S68, keeping on with the parallel display screen of the entire compressed waveform and the zoomed waveform. When it is concluded in Step S69 that an instruction for another processing has been given, the routine of processing shifts to a routine for processing of the given instruction (Step S70).

On the other hand, when it is concluded in Step S67 that a time segment to be zoomed in on has been specified by the user, the specified time segment is identified (Step S71). Then, a waveform portion is selected from waveform portions having the specified property suited to the set range in the specified time segment sequentially in the order of an increasing value expressing the specified property, and the selected waveform portion is zoomed in on and displayed on the lower side of the screen of the LCD 9 (Step S72). At this time, the entire compressed waveform is continuously displayed on the upper side of the screen of the LCD 9 while identifying which portion the zoomed time segment belongs to.

Incidentally, in Step S72, setting may be done as follows. That is, of all the time segments, a waveform portion is selected from waveform portions having the specified property suited to the set range sequentially in the order of a decreasing value expressing the specified property, and the selected waveform portion is zoomed in on and displayed on the lower side of the screen of the LCD 9.

Further, at the time of the display in Step S72, the zoomed portion may be switched sequentially automatically in response to a user's instruction to "zoom in on the next waveform", or may be switched sequentially automatically whenever a fixed time has been passed.

Next, it is judged whether the time segment specified to be zoomed in on has been changed on the entire compressed waveform by the user or not (Step S73). When it is concluded that the specified time segment has been changed, the routine of processing returns to Step S71, so that the changed time segment is identified, a waveform portion is selected from waveform portions having the specified property suited to the set range in the time segment sequentially in the order of an increasing value expressing the specified property, and the selected waveform portion is zoomed in on and displayed on the lower side of the screen of the LCD 9 (Step S72).

When it is concluded in Step S73 that the specified time segment has not been changed, it is judged whether an instruction for another processing has been given or not (Step S74). When it is concluded that no instruction for another processing has been given, the routine of processing returns to Step S72, keeping on with the parallel display screen of the entire compressed waveform and the zoomed waveform. When it is concluded in Step S74 that an instruction for another processing has been given, the routine of processing shifts to a routine for processing of the given instruction (Step S75).

Figure 13:
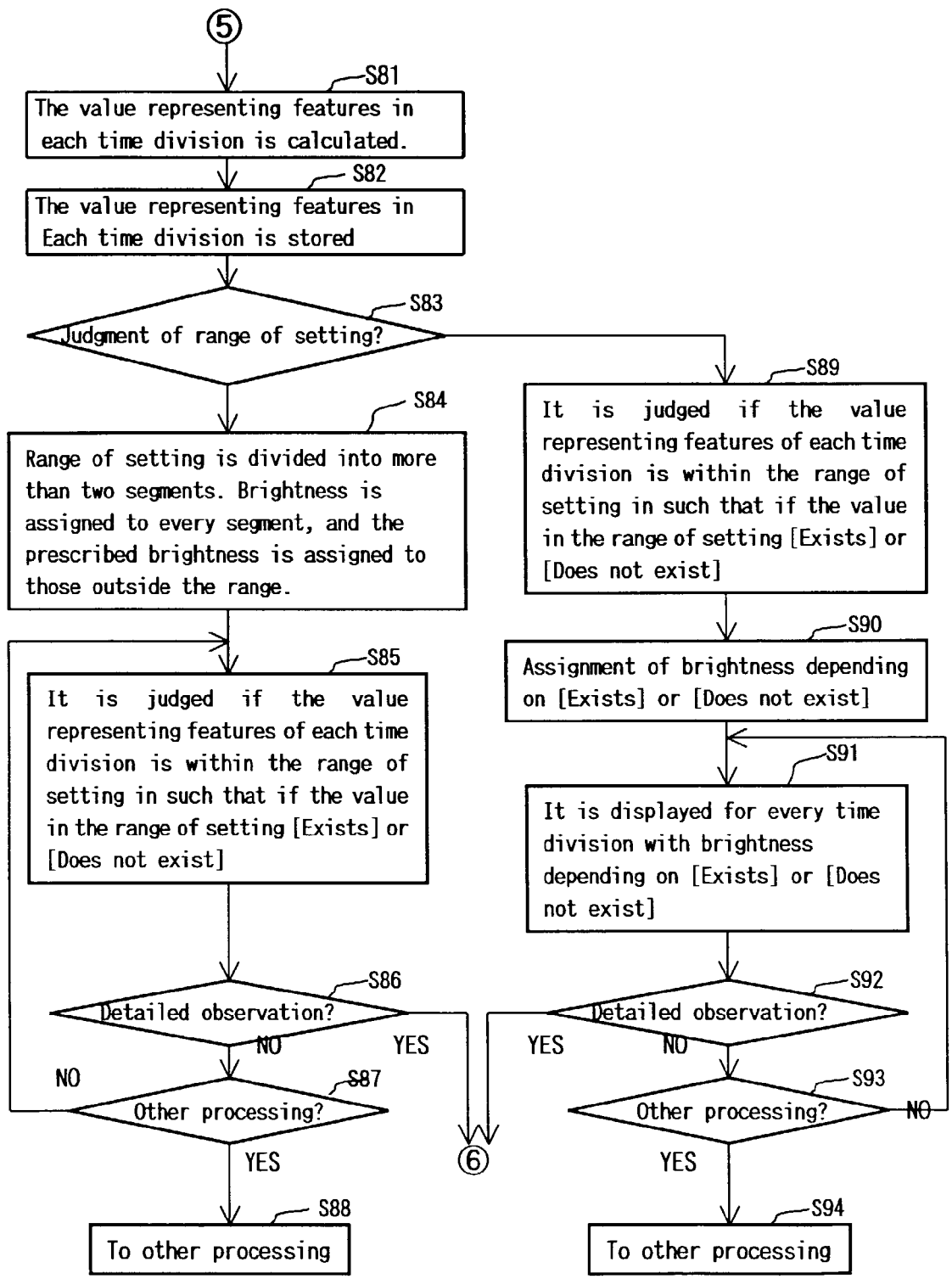
Figure 14:
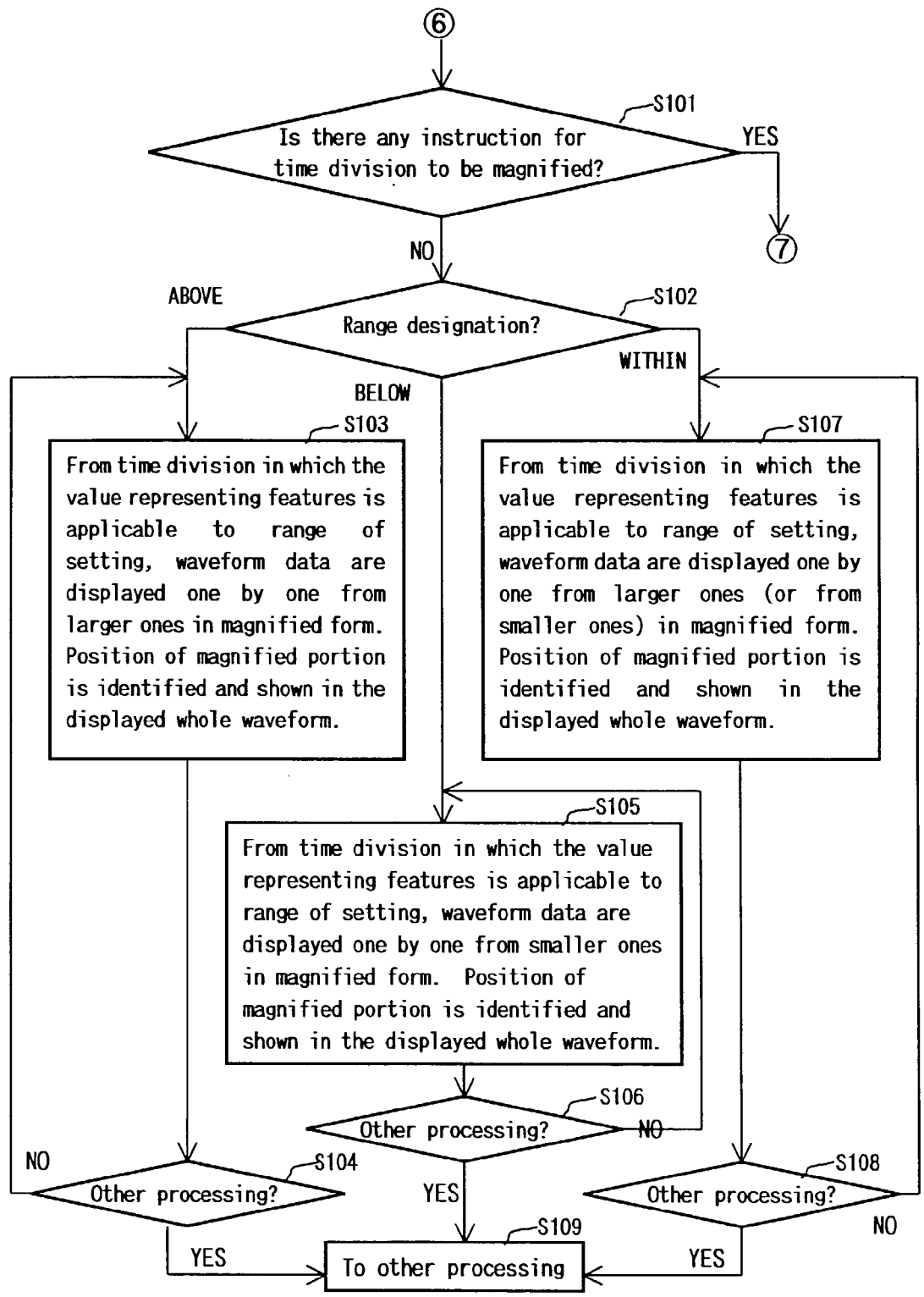
Figure 15:
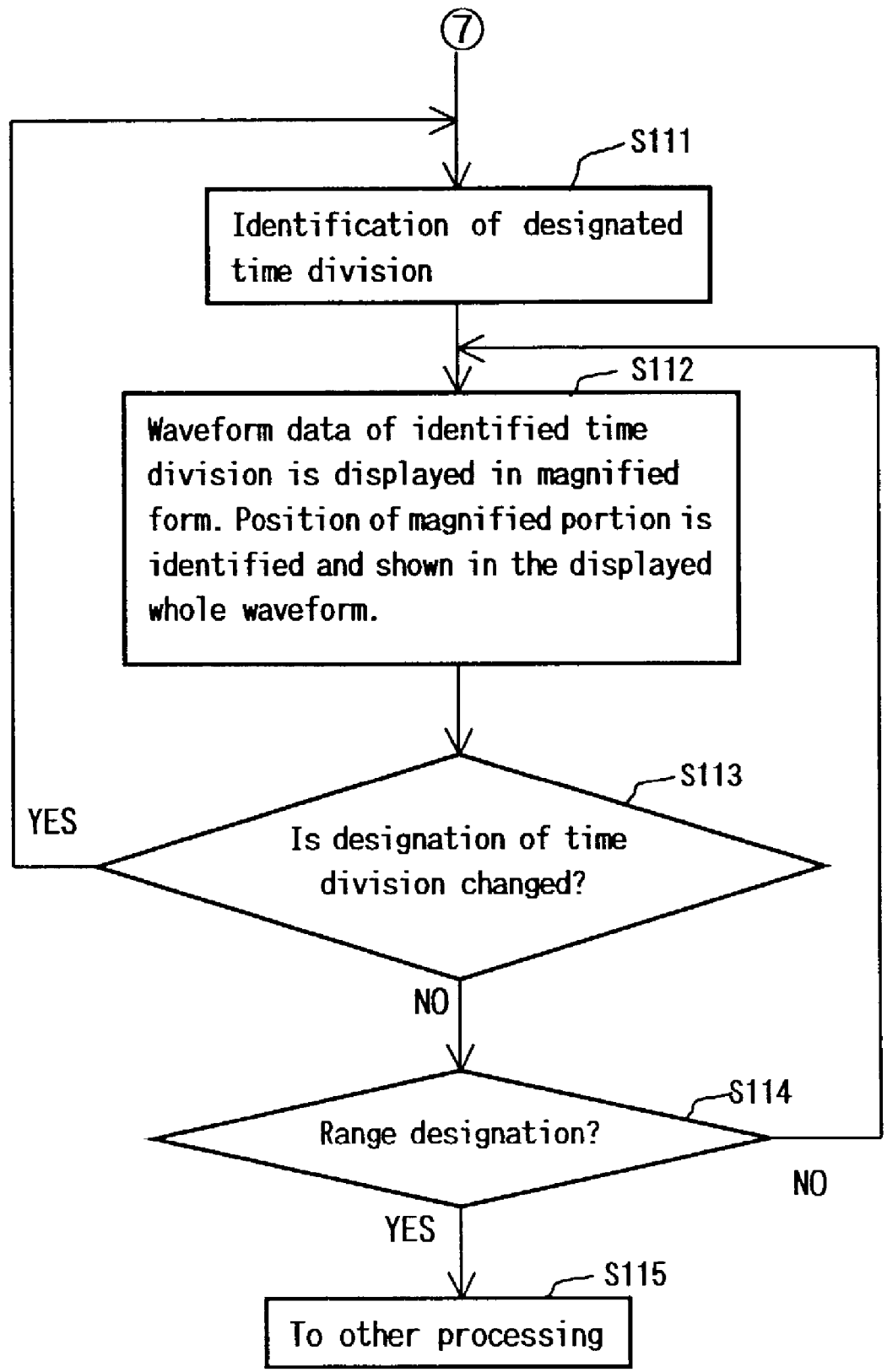

Next, it is concluded in Step S11 in FIG. 8 that the specified property has only one value in each time segment, the processing routine of FIGS. 13 to 15 is executed.

That is, first, a value expressing the property in each time segment is calculated by the arithmetic processing portion 14 or the software arithmetic processing carried out by the microprocessor 10 (Step S81). Then, the calculated value expressing the property in each time segment is stored in the main memory 11 so as to be associated with the time segment. At this time, a value expressing the specified property in each of two adjacent time segments is also calculated in accordance with necessity, for example, in accordance with the kind of the specified property, and stored in association with those time segments (Step S82).

Next, the range set for the specified property and inputted through the operating portion 13 by the user is judged (Step S83). When it is concluded that the set range is "not smaller than the lower limit reference value" or "not larger than the upper limit reference value", the set range is divided into a plurality of split ranges, and the way to reflect in each split range and the way to reflect in a range out of the set range are determined. In this example, as for the way to reflect, a variation in brightness value is used as described previously. Therefore, different brightness values from one another are assigned to the respective split ranges while a brightness value different from those assigned brightness values is evenly assigned to the range out of the set range (Step S84).

Next, it is judged which split range determined in Step 84 the value expressing the specified property in each time segment belongs to or whether the value expressing the specified property does not belong to any split range and is out of the set range. Then, the brightness value assigned to the judged range is identified. Then, the pixel value of the waveform display portion based on the compressed display data in each time segment in the entire compressed waveform displayed on the screen of the LCD 9 is displayed with the identified brightness value (Step S85).

Then, in such a manner, on the display screen of the entire compressed waveform on which the value expressing the specified property is reflected in each time segment, it is judged whether an instruction to observe the details has been given through the operating portion 13 by the user or not (Step S86). When it is concluded that no instruction to observe the details has been given, it is judged whether an instruction for another processing has been given or not (Step S87). When it is concluded that no instruction for another processing has been given, the routine of processing returns to Step S85, keeping on with the display screen of the entire compressed waveform in which the value expressing the property has been reflected on the waveform portion in each time segment.

When it is concluded in Step S87 that an instruction for another processing has been given, the routine of processing shifts to a routine for processing of the given instruction (Step S88). On the other hand, when it is concluded in Step S86 that the instruction to observe the details has been given, the routine of processing is followed by the routine of FIG. 14.

On the other hand, when it is concluded in Step S83 that the set range is a specific range section set to be "not smaller than the lower limit reference value and not larger than the upper limit value", it is judged whether the value expressing the specified property in each time segment is a value within the set specific range section or not. That is, it is detected whether a value expressing the specified property suited to the set range exists in each time segment or not. Then, the presence/absence of the value expressing the specified property suited to the set range is set as a value expressing the specified property for each time segment, and the presence/absence of the specified property in the time segment is stored in the main memory 11 (Step S89).

Next, as for the way to reflect "presence" and "absence" of the value expressing the specified property suited to the set range in this example, different brightness values from each other are assigned (Step S90). Then, the pixel value of the waveform display portion based on the compressed display data in each time segment in the entire compressed waveform displayed on the screen of the LCD 9 is displayed with the brightness value corresponding to "presence" or "absence" of the value expressing the specified property in the time segment (Step S91).

Incidentally, the following manner maybe adopted. That is, for each time segment in which the value expressing the specified property suited to the set range is "present", the value expressing the property is also stored in the main memory 11. The set range is divided into a plurality of split ranges, and a brightness value is determined for each split range. In accordance with which split range the value expressing the property and stored in the main memory 11 belongs to, the display brightness value for the time segment is determined. In this case, a value different from the brightness values each assigned correspondingly to the "presence" of the value expressing the specified property suited to the set range is evenly assigned to each time segment in which the value expressing the specified property suited to the set range is "absent".

Then, in such a manner, on the display screen of the entire compressed waveform on which the value expressing the specified property is reflected in each time segment, it is judged whether an instruction to observe the details has been given through the operating portion 13 by the user or not (Step S92). When it is concluded that no instruction to observe the details has been given, it is judged whether an instruction for another processing has been given or not (Step S93). When it is concluded that no instruction for another processing has been given, the routine of processing returns to Step S91, keeping on with the display screen of the entire compressed waveform in which the value expressing the property has been reflected on the waveform portion in each time segment. When it is concluded in Step S93 that an instruction for another processing has been given, the routine of processing shifts to a routine for processing of the given instruction (Step S94).

On the other hand, when it is concluded in Step S92 that the instruction to observe the details has been given, the routine of processing is followed by the routine of FIG. 14.

In the processing routine of FIG. 14, first, it is judged whether a time segment to be zoomed in on has been specified on the displayed entire compressed waveform by the user or not (Step S101). When it is concluded that no time segment has been specified, it is judged which category the range set by the user belongs to (Step S102).

When it is concluded that the set range is "not smaller than the lower limit reference value", of all the time segments, a zoomed waveform of a time segment having a value of the specified property suited to the set range is displayed on the lower side of the screen of the LCD 9 sequentially in the order of a decreasing value expressing the specified property (Step S103). At this time, the entire compressed waveform is continuously displayed on the upper side of the screen of the LCD 9 while identifying which portion the zoomed time segment belongs to.

Incidentally, at the time of the display in Step S103, the zoomed portion may be switched sequentially automatically in response to a user's instruction to "zoom in on the next waveform", or may be switched sequentially automatically whenever a fixed time has been passed.

Next, it is judged whether an instruction for another processing has been given or not (Step S104). When it is concluded that no instruction for another processing has been given, the routine of processing returns to Step S103, keeping on with the parallel display screen of the entire compressed waveform and the zoomed waveform. When it is concluded in Step S104 that an instruction for another processing has been given, the routine of processing shifts to a routine for processing of the given instruction (Step S109).

When it is concluded in Step S102 that the set range is "not larger than the upper limit reference value", of all the time segments, a zoomed waveform of each time segment having a value of the specified property suited to the set range is displayed on the lower side of the screen of the LCD 9 sequentially in the order of an increasing value expressing the specified property (Step S105). At this time, the entire compressed waveform is continuously displayed on the upper side of the screen of the LCD 9 while identifying which portion the zoomed time segment belongs to.

Incidentally, at the time of the display in Step S105, the zoomed portion may be switched sequentially automatically in response to a user's instruction to "zoom in on the next waveform", or may be switched sequentially automatically whenever a fixed time has been passed.

Next, it is judged whether an instruction for another processing has been given or not (Step S106). When it is concluded that no instruction for another processing has been given, the routine of processing returns to Step S105, keeping on with the parallel display screen of the entire compressed waveform and the zoomed waveform. When it is concluded in Step S106 that an instruction for another processing has been given, the routine of processing shifts to a routine for processing of the given instruction (Step S109).

When it is concluded in Step S102 that the set range is "not smaller than the lower limit reference value and not larger than the upper limit reference value", of all the time segments, a zoomed waveform of each time segment having a value of the specified property suited to the set range is displayed on the lower side of the screen of the LCD 9 sequentially in the predetermined order of either an increasing value or a decreasing value expressing the specified property (Step S107). At this time, the entire compressed waveform is continuously displayed on the upper side of the screen of the LCD 9 while identifying which portion the zoomed time segment belongs to.

Incidentally, at the time of the display in Step S107, the zoomed portion may be switched sequentially automatically in response to a user's instruction to "zoom in on the next waveform", or may be switched sequentially automatically whenever a fixed time has been passed.

Next; it is judged whether an instruction for another processing has been given or not (Step S108). When it is concluded that no instruction for another processing has been given, the routine of processing returns to Step S107, keeping on with the parallel display screen of the entire compressed waveform and the zoomed waveform. When it is concluded in Step S108 that an instruction for another processing has been given, the routine of processing shifts to a routine for processing of the given instruction (Step S109).

On the other hand, when it is concluded in Step S101 that a time segment to be zoomed in on has been specified by the user, the specified time segment is identified (Step S111 in FIG. 15). Then, a zoomed waveform of the specified time segment using the waveform data of the time segment is displayed on the lower side of the screen of the LCD 9 (Step S112). At this time, the entire compressed waveform is continuously displayed on the upper side of the screen of the LCD 9 while identifying which portion the zoomed time segment belongs to.

Next, it is judged whether the time segment specified to be zoomed in on has been changed on the entire compressed waveform by the user or not (Step S113). When it is concluded that the specified time segment has been changed, the routine of processing returns to Step S111, so that the time segment is identified and a zoomed waveform of the time segment is displayed on the lower side of the screen of the LCD 9 (Step S112).

When it is concluded in Step S113 that the specified time segment has not been changed, it is judged whether an instruction for another processing has been given or not (Step S114). When it is concluded that no instruction for another processing has been given, the routine of processing returns to Step S112, keeping on with the parallel display screen of the entire compressed waveform and the zoomed waveform. When it is concluded in Step S114 that an instruction for another processing has been given, the routine of processing shifts to a routine for processing of the given instruction (Step S115).

Next, the operation will be described further along its specific examples.

Figure 17:
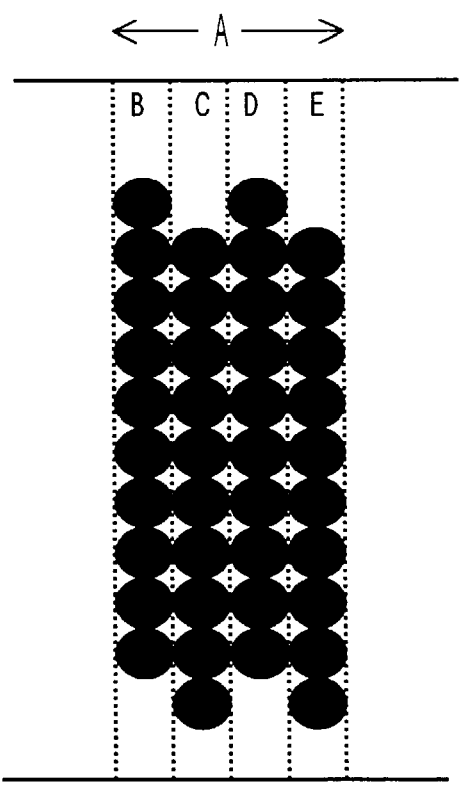
FIG. 17 is a partially enlarged view of FIG. 16.

FIG. 16 shows an example in which the time length of waveform data captured in the acquisition memory 6 is divided into 1,000 time segments, and compressed display data is generated for each time segment so that the entire waveform captured in the acquisition memory 6 is compressed and displayed on the basis of the compressed data. In addition, FIG. 17 shows the portion of a section A in FIG. 16 which is zoomed in on. In this example, the section A includes four time segments B, C, D and E.

As is understood from FIG. 17, in this embodiment, as described previously, as for compressed display data for each time segment, a maximum value and a minimum value of waveform data in each time segment are obtained, and the compressed display data is regarded as formed out of pixels corresponding to the maximum value and the minimum value and all of pixels corresponding to values between the maximum value and the minimum value. Thus, those pixels are lit and displayed with predetermined brightness as shown by the black circles in FIG. 17.

Accordingly, in this compressed waveform display of the entire waveform, a maximum value and a minimum value of signals included in each time segment are extracted, and the line connecting the maximum value and the minimum value is displayed (joint display). Thus, as shown in FIG. 16, the waveform as a whole is painted evenly so that the properties of the waveform cannot be grasped. Even if the waveform is expressed in any other display method, for example, even if all the data is displayed or frequency information of data in each time segment is expressed by brightness, color or density, any detailed information of the waveform such as + pulse width cannot be grasped directly from the display itself.

However, in this embodiment, as described previously, the user can specify a property of the waveform to be observed. Thus, it is possible to reflect the specified property on the entire compressed waveform, and detailed information of the waveform such as + pulse width can be grasped.

By way of example of a specified property of a waveform in which there are a plurality of values expressing the specified property in one time segment, specific description will be made below about the case where + pulse width is specified as a property of a waveform to be observed by a user. In the following description, in order to simplify the description, the processing operation of a section A including four time segments B, C, D and E will be described representatively, instead of describing the processing upon all the time sections of an entire compressed waveform.

Figure 18:
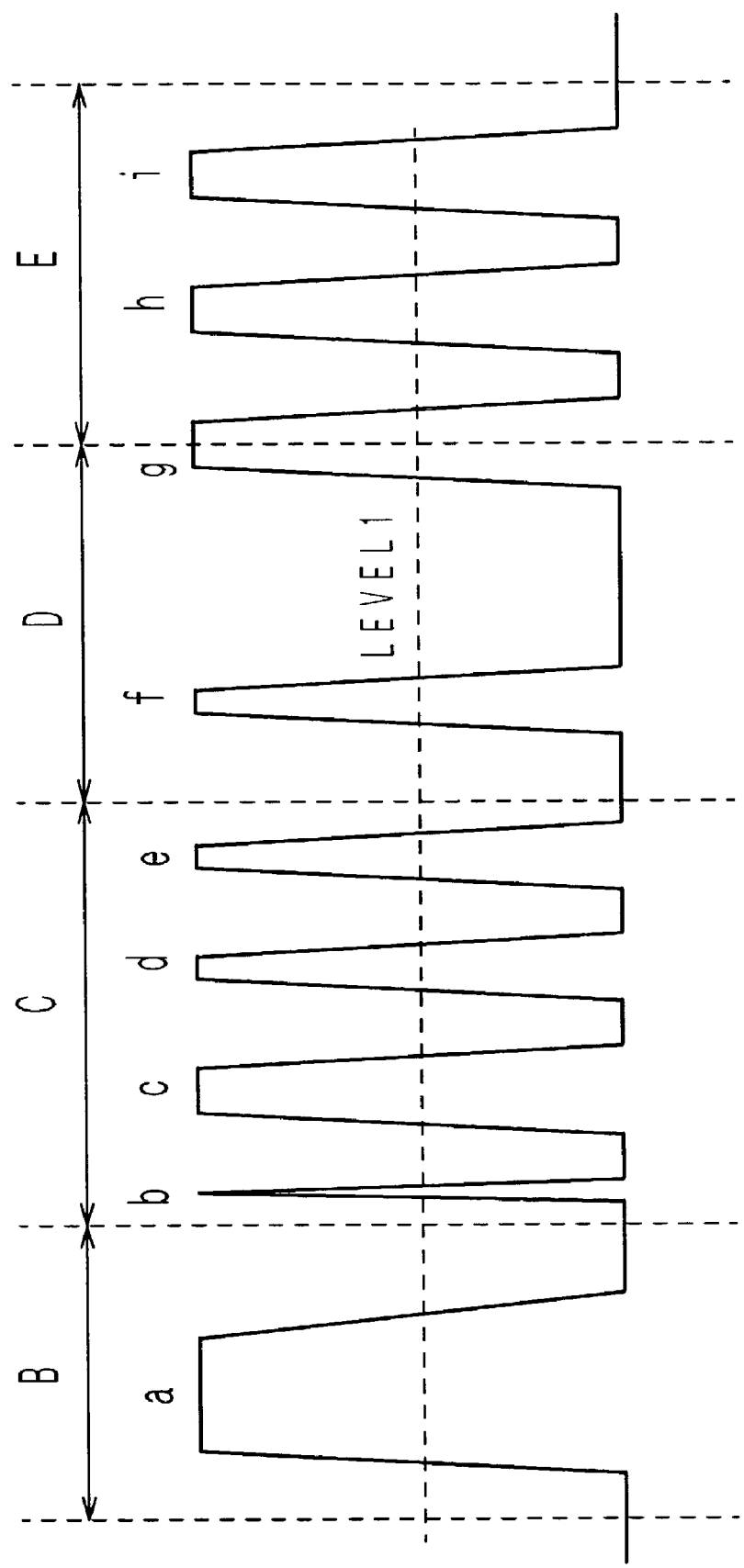
FIG. 18 is an enlarged view of an example of a waveform using waveform data corresponding to the display portion of FIG. 17.

Now, for example, assume that a plurality of pulses as shown in FIG. 18 are included in the time segments B, C, D and E shown in FIG. 17 when all the data included in the time segments B, C, D and E is zoomed in on. As described previously, when an instruction to specify + pulse width as a property of the waveform to be observed is given through the operating portion 13 by the user, the microprocessor 10 gives the arithmetic processing portion 14 an instruction to extract + pulse signals.

In response to the instruction, the arithmetic processing portion 14 extracts + pulse signals crossing a threshold level (LEVEL 1) specified in advance, in each time segment. Then, the extraction result is stored in the main memory 11 in accordance with an instruction from the microprocessor 10. That is, when description is made on FIG. 18, waveform data is searched sequentially from the data head of the time segment B. Then, whenever a + pulse signal is founded, the start address in which the waveform data forming the + pulse signal crossing LEVEL 1 is stored, and the value of the + pulse width thereof are stored in the main memory 11.

FIG. 19 shows the state where the waveform storage start addresses and the + pulse width values have been stored in the four time segments B, C, D and E in practice. Here, assume that a pulse signal extending over two time segments such as a pulse g in FIG. 18 belongs to the earlier one of the time segments. Therefore, the pulse g is regarded here as belonging to the time segment D.

Next, a value expressing a property in each time segment is obtained. In this case, as a first example of a range set by a user, assume that setting is done to extract + pulse width not larger than an upper limit reference value which is, for example, 100 ns (ns means nano second, the same thing will be applied to the following cases). In this case, a minimum value of + pulse width in each time segment is detected from the data of the extracted + pulse signals, and the value thereof is stored as a value expressing the property in the time segment.

An example using the time segments B, C, D and E will be shown. The smallest + pulse width in each time segment is detected from the data of the + pulse signals in FIG. 19, and the value thereof is stored in the main memory 11 as the value expressing the property in that time segment. In this example, since the time segment B has only the pulse a, the value 150 ns of the + pulse width of the pulse a is stored as the value expressing the property in that time segment. In the time segment C, the value 5 ns of the pulse b having the smallest + pulse width in pulses b, c, d and e is stored as the value expressing the property in that time segment.

By similar processing, the smallest + pulse width values (minimum values), that is, the value 15 ns of a pulse f in the time segment D and the value 40 ns of a pulse i in the time segment E are stored as the values expressing the property in those time segments respectively. FIG. 20 shows the results stored thus for the time segments B, C, D and E in the first example where the range is set to be not larger than the upper limit reference value.

As a second example of a range set by a user, assume that setting is done to extract + pulse width not smaller than a lower limit reference value which is, for example, 10 ns (ns means nano second, the same thing will be applied to the following cases). In this case, a maximum value of + pulse width in each time segment is detected from the data of the extracted + pulse width, and the value is stored in the main memory 11 as a value expressing the property in that time segment. FIG. 21 shows the results stored thus for the time segments B, C, D and E in the second example where the range is set to be not smaller than the lower limit reference value. In other words, the maximum values in the respective time segments, that is, the value 150 ns of a pulse a in the time segment B, the value 50 ns of a pulse c in the time segment C, the value 60 ns of a pulse g in the time segment D and the value 50 ns of a pulse h in the time segment E are stored as values expressing the property in those time segments respectively.

Further, as a third example of a range set by a user, assume that setting is done to extract + pulse width not smaller than a lower limit reference value which is, for example, 100 ns, or not larger than a value which is, for example, $10\,\mu s$. In this case, the presence/absence of a pulse satisfying the set range in each time segment on the basis of the extracted + pulse width data is stored in the main memory 11 as a value expressing the property in that time segment. FIG. 22 shows the results stored thus for the time segments B, C, D and E in the case for the third example. In other words, as pulses satisfying the set range in the respective time segments, the pulse a has a width of 150 ns satisfying the set range in the time segment B. Thus, the time segment B has a property of "present". In the time segments C to E, there is no pulse not smaller than 100 ns. Therefore, there is no pulse satisfying the set range, and each of the time segments has a property of "absent". Thus, the value of "absent" is stored.

Next, there will be shown an example of processing for determining information calculated thus to be reflected on waveform data in each time segment in the entire compressed waveform on the screen on the basis of the detection results of the values expressing the property in the time segment. Here, as described previously, an example in which property information is reflected as brightness of waveform data on the display screen will be shown. However, as described previously, the property information may be reflected through color, density, identifying marks, and so on, besides brightness. The same thing can be applied to the following description.

First, when the range is set to be not larger than 100 ns as in the first example, + pulse width values within the set range are classified into a plurality of classes, and information about the way to reflect is determined in each classified class. FIG. 23 shows an example in which the + pulse width values within the set range are classified into 10 classes. Here, the + pulse width values not larger than 100 ns are classified by every 10 ns. Then, as for the way to reflect, the brightness is increased by +10% whenever the + pulse width value is reduced by 10 ns. That is, the brightness is set at +90% when the + pulse width value is equal to or smaller than 10 ns. The brightness is reduced by 10% whenever the + pulse width value increases by 10 ns. The brightness is set at 0% of the standard when the + pulse width value is larger than 90 ns but not larger than 100 ns. In addition, each + pulse width having a value out of the set range, that is, larger than 100 ns, is evenly expressed by the reduced brightness of −50% in order to make it easy to identify the data within the set range.

Next, the information of brightness to be reflected in each time segment is determined on the basis of the table of FIG. 23. FIG. 24 shows the information of brightness for the time segments B, C, D and E determined on the basis of the table of FIG. 23. That is, in the time segment B, the brightness is set at −50% because of the presence of the pulse a having a + pulse width of 150 ns which is larger than 100 ns and out of the set range. In the time segment C, the brightness is set at +90% because of the presence of the pulse b having a + pulse width of 5 ns which is the smallest value within the set range. In the time segment D, the brightness is set at +80% because of the presence of the pulse f having a + pulse width of 15 ns which is the smallest value within the set range. In the time segment E, the brightness is set at +60% because of the presence of the pulse i having a + pulse width of 40 ns which is the smallest value within the set range. Compressed display data for each time segment in the entire compressed waveform is displayed on the basis of the brightness information obtained thus. As a result, also in the entire compressed waveform displayed in compression, it is possible to grasp the property about the + pulse width easily and by the light of nature.

Figure 25:
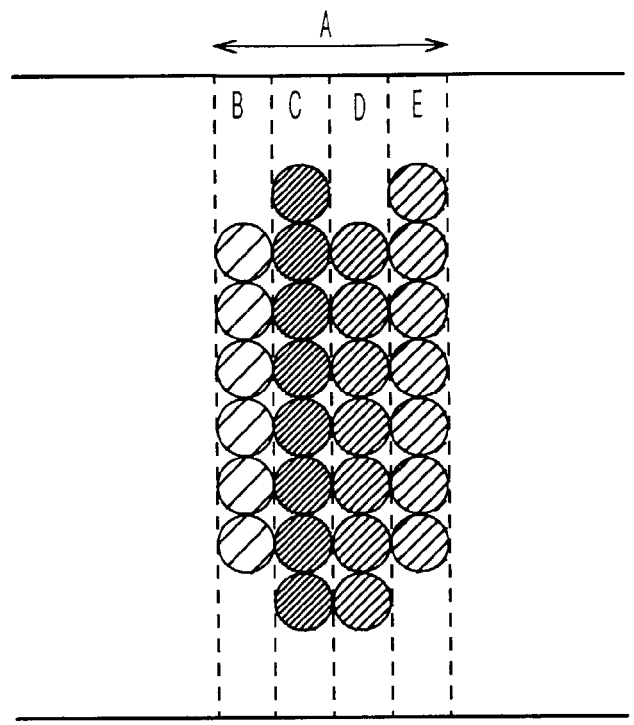

FIG. 25 shows a display example of the time segments B, C, D and E schematically. FIG. 25 shows that the richer a density of hatching of a circle is, the higher the brightness of the pixel designated by the circle has. That is, in the time segment B, the brightness is set at −50% because of the presence of the pulse a having a + pulse width of 150 ns which is out of the set range. Thus, the brightness in the time segment B becomes extremely weak and dark. In the time segment C, the brightness is set at +90% because of the presence of the pulse b having a + pulse width of 5 ns which is the smallest value within the set range. Thus, the brightness in the time segment C becomes the highest. In the time segment D, the brightness is set at +80% because of the presence of the pulse f having a + pulse width of 15 ns which is the smallest value within the set range. Thus, the brightness in the time segment D becomes the second-highest following the time segment C. In the time segment E, the brightness is set at +60% because of the presence of the pulse i having a + pulse width of 40 ns which is the smallest value within the set range. Thus, the brightness in the time segment E becomes further lower than that in the time segment D. The same thing can be applied to the schematic views of display examples which will be described later.

Here, as for the same waveform data captured in the acquisition memory 6, the start addresses of waveform data forming + pulse signals and the + pulse width values have been stored in the main memory 11 (see FIG. 19). Therefore, without detecting the + pulse signals again, the conditions the easiest to identify the property of the waveform can be produced by changing the set range of + pulse width to be extracted and thereby changing the way to reflect on the basis of brightness information. It is therefore possible to obtain the property of an unknown waveform easily and by the light of nature.

Figure 26:
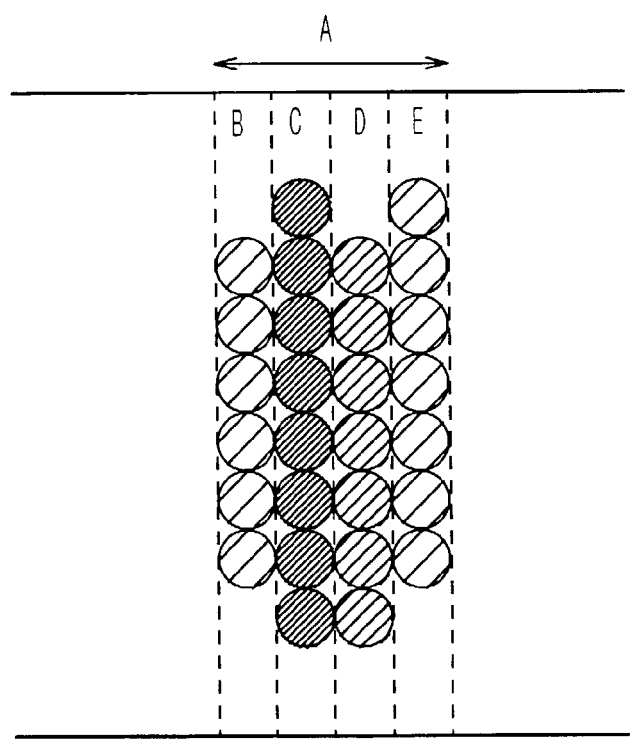

For example, when the range of + pulse width to be extracted is made wider to be not 100 ns or less but 100 μs or less, it is possible to grasp the rough distribution of + pulses included in the entire waveform. On the contrary, when the range of + pulse width to be extracted is made narrower to be not 100 ns or less but 20 ns or less, it is possible to surely grasp only phenomena such as a glitch. FIG. 26 schematically shows a display example of the time segments B, C, D and E when the range of + pulse width to be extracted is made not larger than 20 ns. That is, in the time segment B, the brightness is set at −50% because of the presence of the pulse a having a + pulse width of 150 ns which is out of the set range. Thus, the brightness in the time segment B becomes extremely weak and dark. In the time segment C, the brightness is set at +90% at maximum because of the presence of the pulse b having a +pulse width of 5 ns which is the smallest value within the set range, and the pulse d having a + pulse width of 20 ns within the set range. Thus, the brightness in the time segment C becomes the highest. In the time segment D, the brightness is set at +80% because of the presence of the pulse f having a + pulse width of 15 ns which is the smallest value within the set range. Thus, the brightness in the time segment D becomes the second-highest next to the time segment C. In the time segment E, the brightness is set at −50% because of the presence of the pulses h and i having + pulse widths of 50 ns and 40 ns respectively which are both out of the set range. Thus, the brightness in the time segment E becomes lower in the same manner as that in the time segment B.

Similarly in the case of the second example of the set range, + pulse width values within the set range not smaller than 10 μs are classified into a plurality of classes, and different degrees of reflection are determined for the respective split classes. In this example, different brightness values are assigned to the split classes respectively in the same manner as that shown in FIG. 23. In addition, a brightness value different from those within the set range is evenly assigned to each + pulse width having a value out of the set range, that is, not larger than 10 μs. Then, brightness information for reflection is determined for each time segment on the basis of such assignment, so that a waveform portion in each time segment is displayed with the determined brightness value in the entire compressed waveform.

In the case of the third example of the set range, determination is made so that different brightness values are assigned to vary the degree of reflection in accordance with the presence/absence of a + pulse width value within the set range not smaller than 100 ns and not larger than 10 μs. Then, brightness information for reflection is determined for each time segment on the basis of such assignment, so that a waveform portion in each time segment is displayed with the determined brightness value in the entire compressed waveform.

Next, description will be made on a specific example of a processing method in which, when a part of the entire compressed waveform with the property of the waveform being identified by the processing is observed in further detail, all of waveform portions each having a value within a set range for extracting the property are zoomed in on automatically with optimum setting in an order determined by the setting of the range.

FIG. 27 shows a display example in which the range of + pulse width to be extracted from waveform data in FIG. 16 is set to be not larger than 10 ns. FIG. 27 shows the case where there are three time segments C, F and G as time segments each having a + pulse width not larger than 10 ns.

Here, when the waveform about + pulse width not larger than 10 ns is observed in detail, the time segments F, C and G having the highest brightness are zoomed in on and observed manually in FIG. 27 if the invention is not applied. However, according to this embodiment, the desired portions can be automatically zoomed in on and observed in the optimum state easily as follows.

That is, as described previously, the user operates the operating button of the operating portion 13 so as to input an instruction to observe the details. Then, the microprocessor 10 extracts values expressing the specified property suited to the set range.

FIG. 28 shows data stored in the main memory 11 when an instruction to observe the details has been given in the case where the range of + pulse width to be extracted from the waveform data in FIG. 16 is set to be not larger than 10 ns. The data is constituted by time segments including + pulse signals within the set range, start addresses and + pulse width values of waveform data forming the + pulse signals, and pulse names.

Now, here, assume that no time segment to be zoomed in on has not been specified by the user. Then, since the set range for extracting the property is not larger than the upper limit reference value (not larger than 10 ns), a waveform portion selected from the suited waveform data in all the time segments in the order of an increasing value is zoomed in on automatically so that the details thereof can be recognized.

FIG. 29 shows an example of the display screen where such a waveform portion is zoomed in on automatically in the order of an increasing value of + pulse width. That is, the entire compressed waveform which has been displayed till then is compressed to a half size in the vertical direction as illustrated, and displayed in the upper half area of the screen. Then, the zoomed waveform of the details is displayed in the lower half area of the screen.

To produce the display screen in FIG. 29, the order of an increasing value of + pulse width is first detected from the table of FIG. 28. Here, it is found that the pulse b in the time segment C has the smallest + pulse width of 5 ns. When an instruction to zoom in is executed, setting for displaying the waveform in the optimum state is done automatically by use of the start address of the pulse b and the + pulse width value thereof. (See the flow charts in FIGS. 8 to 15)

Next, when an instruction to display a second pulse is given, 7 ns of a pulse j in the time segment F is displayed in similar processing. Next, when an instruction to display a third pulse is given, 10 ns of a pulse k in the time segment G is displayed in similar processing. Here, as described previously, such an instruction to display an n-th pulse may be based on a user's instruction or on an instruction produced from the microprocessor 10 after a fixed period has passed since the display of an (n−1)th pulse.

On the screen of FIG. 29, a cursor 21 as an example of identification is displayed to be superimposed on the portion of the time segment C including the pulse b so as to make it clear which portion of the entire compressed waveform is zoomed in on.

Incidentally, the identification for making it clear which portion of the entire compressed waveform is zoomed in on is not limited to the cursor. For example, brightness, color, density, an identifying mark, or the like, may be changed to identify the position of the zoomed waveform data.

Although FIG. 29 shows the example in which the entire compressed waveform identifying the property of the waveform and the zoomed waveform of the pulse b are displayed on the same screen, the following manner may be adopted in an apparatus having two LCD screens. That is, the entire compressed waveform is displayed on one of the two screens while the zoomed waveform is displayed on the other.

Although the description has been made on the case where the range is set to be not larger than the upper limit reference value, the following manner is adopted in the case where the range is set to be not smaller than a certain value (for example, not smaller than 10 µs). That is, a waveform portion is selected from all suited waveform data in the time segments in the order of a decreasing value. Then, in the same manner as above, the selected waveform portion is zoomed in on automatically so that the details thereof can be recognized.

On the other hand, when the range is set to be not smaller than the lower limit reference value and not larger than the upper limit reference value (for example, not smaller than 10 ns and not larger than 10 µs), a waveform portion selected from all suited waveform data in the time segments in the order of an increasing or decreasing value is zoomed in on automatically so that the details thereof can be recognized, in the same manner as above.

Then, also in such a case, similarly, when a time segment to be zoomed in on is specified, only waveform data in the specified time segment in the conditions is zoomed in on automatically.

Although the specific examples have shown the case of + pulse width as one of waveform properties, the same things are applied to the case where a waveform property having a plurality of values expressing the property in one time segment is specified as a property to be observed. Examples of such waveform properties include − pulse width, a frequency, a period, duty ratio, rise time, fall time, and the like.

Figure 30:
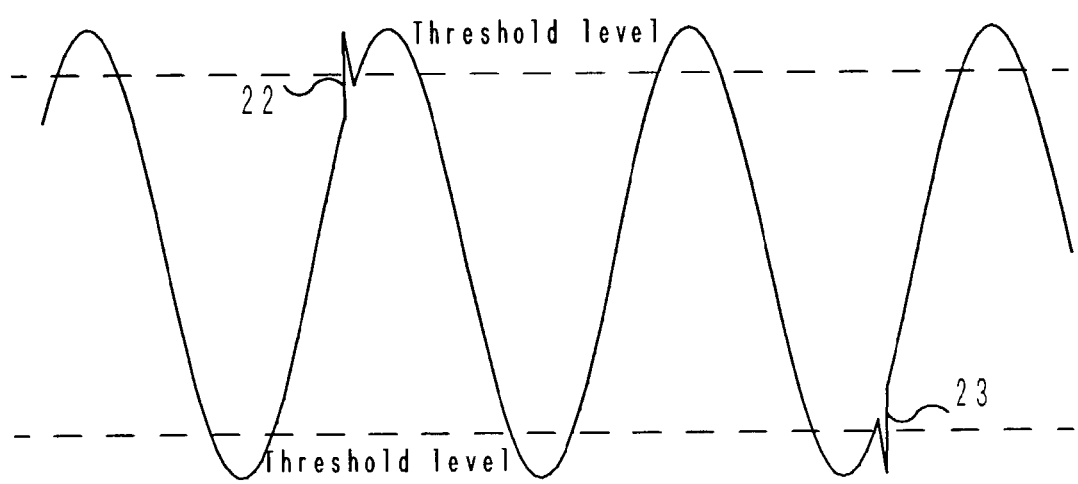
FIG. 30 is a view showing an example of a property which can be observed in the waveform information display apparatus according to the embodiment.

Incidentally, to extract a property such as + pulse width or − pulse width is an effective measure not only for detecting digital signals as shown in the examples but also for detecting a glitch 22 appearing on a repeated sine wave (for example, from a commercial power) as shown in FIG. 30. That is, in this case, a threshold level is set at a level suitable for detecting a glitch so as to select + pulse width and − pulse width and detect a glitch as a pulse having a pulse width narrower than the specified pulse width.

Next, description will be made on a specific example in which the number of pulses is adopted as a property having only one value calculated in each time segment as a value expressing the specified property. This example shows an example of a processing method in which a property about the number of pulses is extracted from digital data forming an entire compressed waveform displayed on the screen, and the extracted result is reflected on the entire compressed waveform on the screen.

Figure 31:
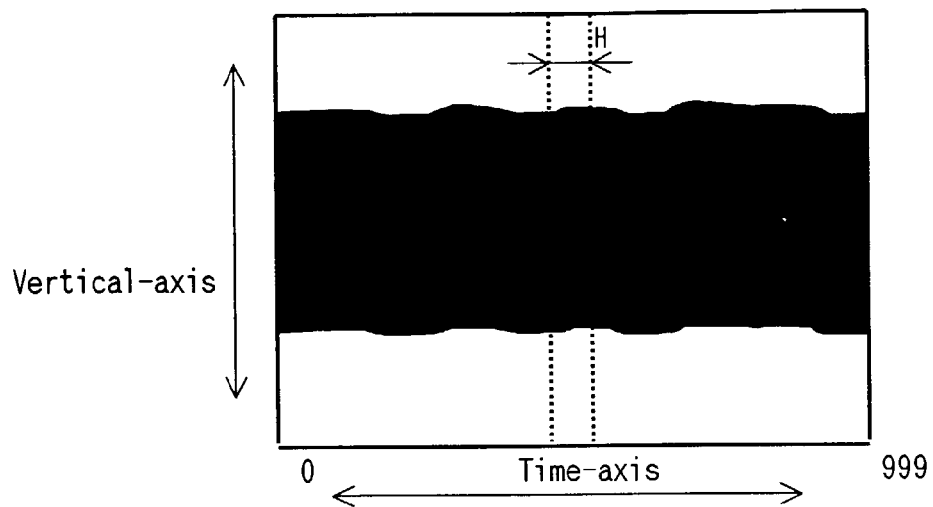
FIG. 31 is a view showing a display example of a compressed waveform in the waveform information display apparatus according to the embodiment.
Figure 32:
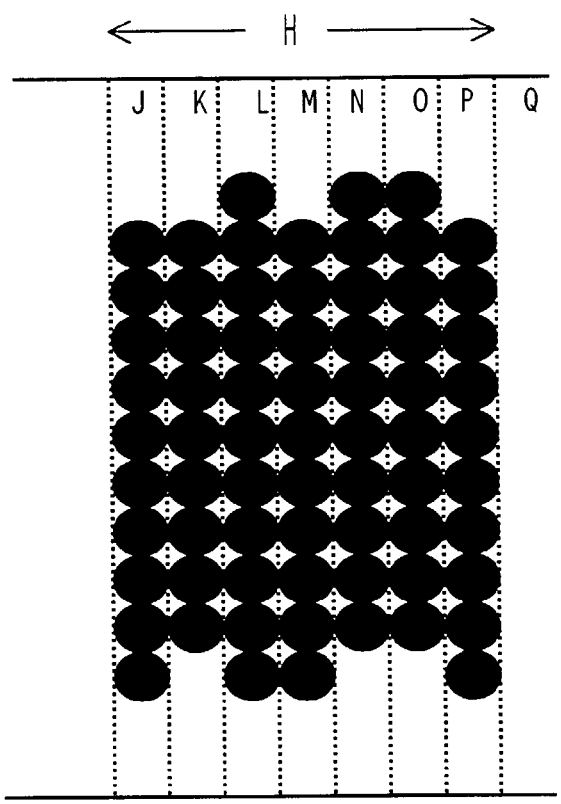
FIG. 32 is a partially enlarged view of FIG. 31.

FIG. 31 shows an example of an entire compressed waveform compressed and displayed on the screen of the LCD 9 on the basis of waveform data captured in the acquisition memory 6 in the same manner as FIG. 16. In addition, FIG. 32 shows a portion of a section H in FIG. 31 which is zoomed in on. In this example, the section H has seven points, that is, seven time segments J, K, L, M, N, O and P in the time axis direction.

Also in this example, as described previously, as for compressed display data for each time segment, a maximum value and a minimum value of waveform data in each time segment are obtained, and the compressed display data in the time segment is regarded as formed out of pixels corresponding to the maximum value and the minimum value and all of pixels corresponding to values between the maximum value and the minimum value. Thus, those pixels are lit and displayed with predetermined brightness as shown by the black circles in FIG. 32.

In the following description, in order to simplify the description, the processing operation of the section H including the seven time segments J, K, L, M, N, O and P, will be described representatively, instead of describing the processing upon all the time sections of the entire compressed waveform.

Figures 33, 34, 35:
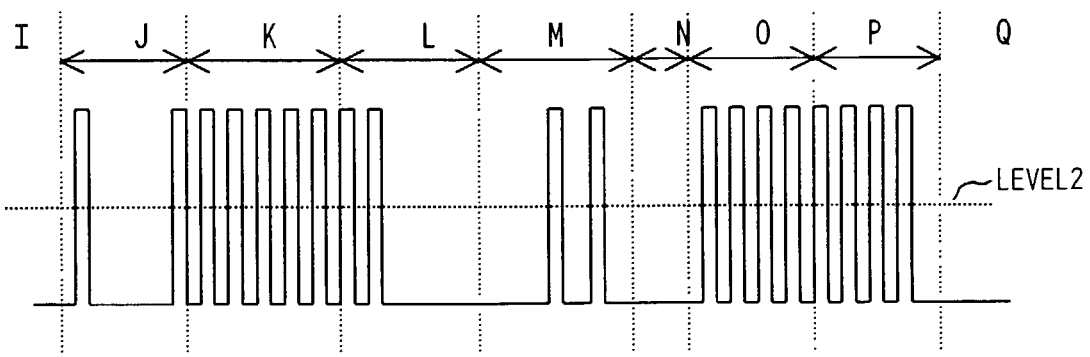

Now, for example, assume that a plurality of pulses as shown in FIG. 33 are included in the respective time segments J, K, L, M, N, O and P shown in FIG. 32 when all the data included in the time segments J, K, L, M, N, O and P is zoomed in on. Although the + pulse width forming the waveform varied in the case of FIG. 18, the + pulse width is substantially constant in this example of FIG. 33.

As described previously, when an instruction to specify the number of pulses as a property of the waveform to be observed is given through the operating portion 13 by the user, the microprocessor 10 gives the arithmetic processing portion 14 an instruction to extract the number of pulses.

When a property on the number of pulses is extracted, a result obtained by making detection on + pulses is substantially equivalent to a result obtained by making detection on − pulses. Accordingly, in this example, + pulse signals crossing a threshold level (LEVEL 2) specified in advance are extracted. At this time, assume that a pulse extending over two time segments belongs to the earlier one of the time segments.

The arithmetic processing portion 14 obtains the number of + pulses detected thus in each time segment. Then, the result is stored in the main memory 11. FIG. 34 shows the result of the obtained number of pulses contained in each of the time segments J, K, L, M, N, O and P. The result is used as a value expressing the property in each time segment. That is, although those in the time segments I and Q are omitted from the table for the sake of simplification of the description, assume that the number of detected pulses is 2 in the time segment I, and the number of detected pulses is 1 in the time segment Q. In addition, the number of detected pulses is 2 in each of the time segments J, L and M; 5 in the time segment K; 0 in the time segment N; and 4 in each of the time segments O and P.

Further, in this example, in addition to the number of pulses in each time segment, the numeric value which is the sum of the numbers of pulses in adjacent two or more time segments is calculated as a value expressing the property. The number of pulses in adjacent two or more time segments is an effective measure for extracting a property about the number of pulses. FIGS. 35 and 36 show the results of the obtained numbers of pulses contained in adjacent two time segments (hereinafter, these consecutive two time segments will be referred to as "adjacent time segment"). That is, 7 pulses are detected in the adjacent time segment J–K; 4 in L–M; 4 in N–O; and 5 in P–Q. On the other hand, 4 pulses are detected in the adjacent time segment I–J; 7 in K–L; 2 in M–N; and 8 in O–P.

Next, there will be shown an example of processing for determining information to be reflected on waveform data in each time segment in an entire compressed waveform on the screen on the basis of the values calculated thus for expressing the property in each time segment. Here, an example in which property information is reflected as brightness of waveform data on the display screen will be shown. However, as described previously, the property information may be reflected through color, density, identifying marks, and so on, besides brightness.

The following description will show an example for detecting a section where a train of a consecutive plurality of pulses, for example, a train of 8 pulses may exist. Incidentally, when a train of a specific number of pulses is to be detected thus, the range is set between a value N−α and a value N+α before and after the number N of pulses to be detected. For example, if α=3 and the number of pulses to be detected is 8, the range will be set to be not smaller than 5 and not larger than 11.

When the upper and lower limits of the range are set thus, reflection information is determined on the basis of whether the value expressing the property in each time segment satisfies the set range or not. For example, the brightness is set at +100% for values satisfying the set range, while the brightness is evenly set at −50% for values which do not satisfy the set range, in order to make identification easier.

That is, in the case of this example, as shown in FIG. 37, the brightness of −50% is assigned to each time segment when the number K of pulses in the time segment satisfies K>11 or K<5, while the brightness of +100% is assigned to each time segment when the number K in the time segment satisfies 5≦K≦11.

Thus, when brightness information in each time segment is determined with reference to the information of the numbers of pulses in the respective time segments J, K, L, M, N, O and P in FIG. 34 on the basis of the assignment in FIG. 37, the brightness information is set for the respective time segments J, K, L, M, N, O and P as shown in FIG. 38. That is, in the time segment J, the brightness is set at −50% because the number of pulses is two, which is smaller than 5. In the time segment K, the brightness is set at +100% because the number of pulses is 5. In each of the time segments L to P, the brightness is set at −50% because the number of pulses is smaller than 5.

Figure 41:
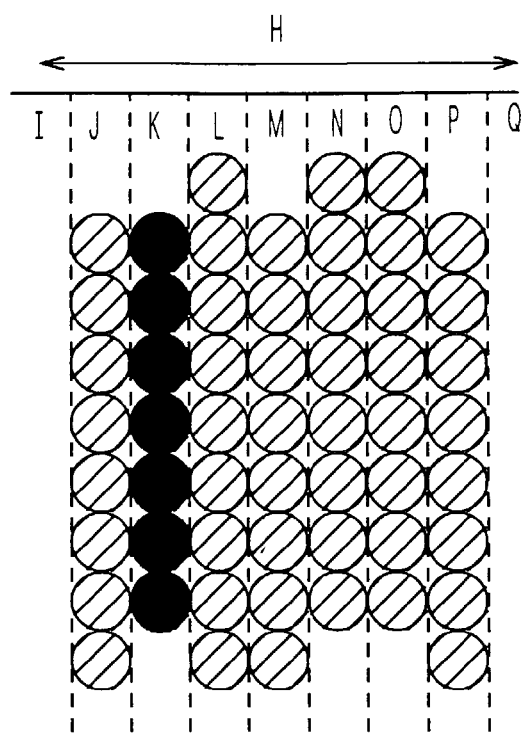

FIG. 41 schematically shows an example of actual display based on this brightness information. In FIG. 41, each black circle designates +100% brightness, and each poor density hatching circle designates −50% brightness. That is, in this property information, only the time segment K has high brightness while the other time segments have low brightness.

Next, description will be made on brightness information in every two consecutive time segments on the basis of the assignment of FIG. 37. First, when brightness information of adjacent time segments J–K, L–M, N–O and P–Q in FIG. 35 is determined with reference to the information of the numbers of pulses in the adjacent time segments J–K, L–M, N–O and P–Q, the brightness information is obtained as shown in FIG. 39. That is, in the respective adjacent time segments J–K and P–Q, the brightness is set at +100% because the numbers of pulses are 7 and 5 respectively. In the respective adjacent time segments L–M and N–O, the brightness is set at −50% because the numbers of pulses are 4 and 4 respectively.

Figure 42:
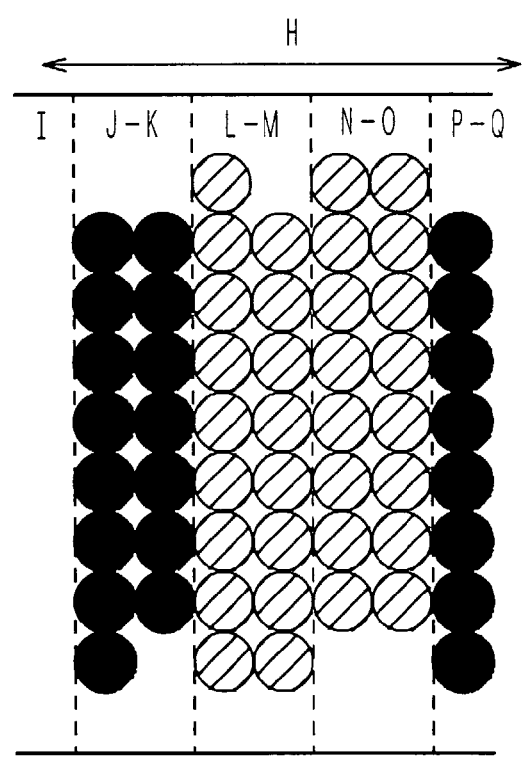

FIG. 42 shows an example of actual display based on this brightness information schematically. Also in FIG. 42, each black circle designates +100% brightness, and each poor density hatching circle designates −50% brightness. That is, in this property information, the adjacent time segments J–K and P–Q have high brightness while the adjacent time segments L–M and N–O have low brightness.

Similarly, when brightness information of adjacent time segments I–J, K–L, M–N and O–P in FIG. 36 is determined with reference to the information of the numbers of pulses in the adjacent time segments I–J, K–L, M–N and O–P, the brightness information is obtained as shown in FIG. 40. That is, in the respective adjacent time segments I–J and M–N, the brightness is set at −50% because the numbers of pulses are 4 and 2 respectively. In the respective adjacent time segments K–L and O–P, the brightness is set at +100% because the numbers of pulses are 7 and 8 respectively.

Figure 43:
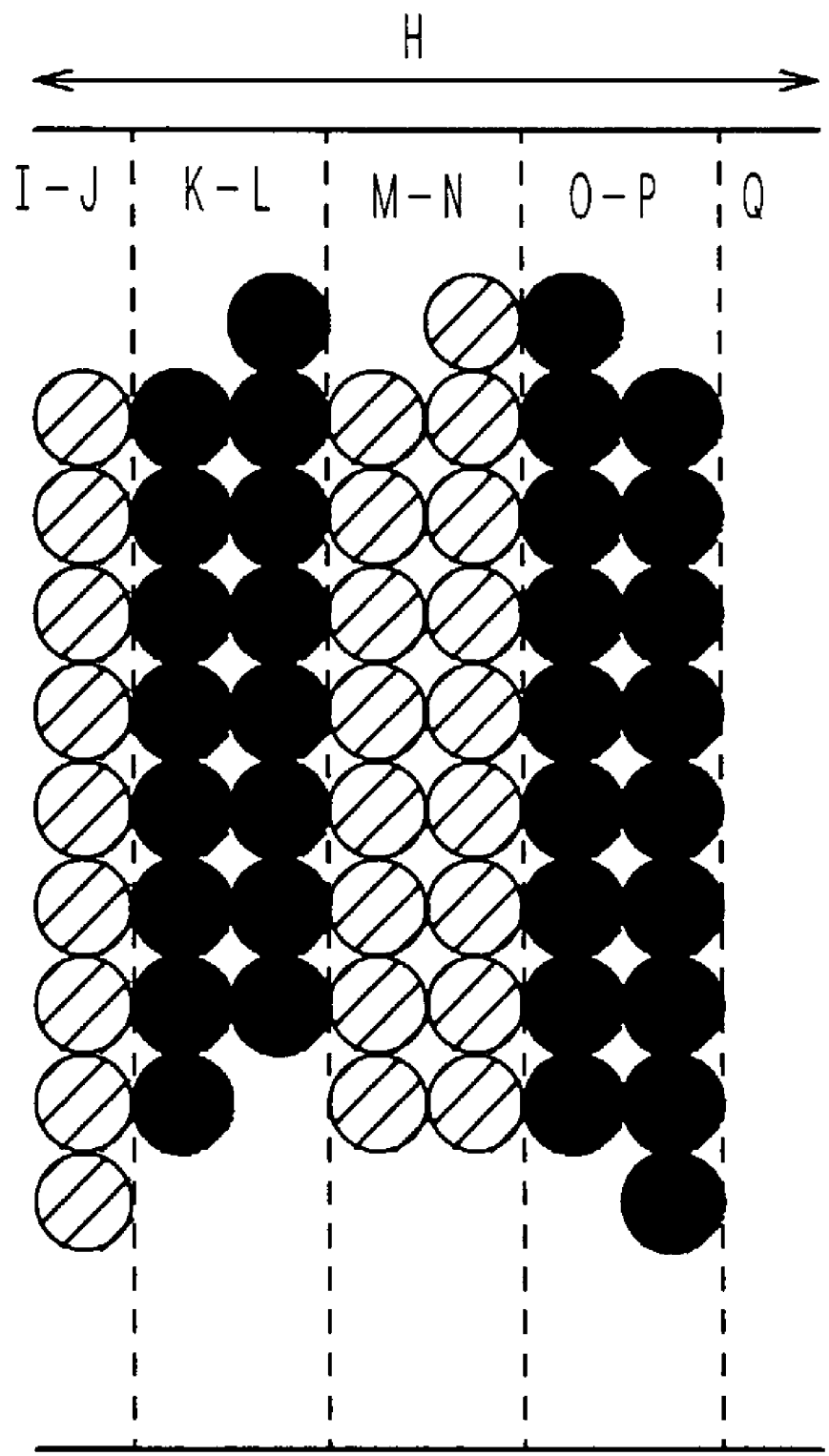

FIG. 43 shows an example of actual display based on this brightness information schematically. Also in FIG. 43, each black circle designates +100% brightness, and each poor density hatching circle designates −50% brightness. That is, in this property information, the adjacent time segments I–J and M–N have low brightness while the adjacent time segments K–L and O–P have high brightness.

In addition, it is proved that in FIG. 42 or 43 in which the number of pulses in every two adjacent time segments is reflected as a property, a train of pulses contained in the time segment O or P is identified and displayed while this train of pulses cannot be identified in FIG. 41 in which the number of pulses in each single time segment is reflected as a property.

In such a manner, when a property about the number of pulses is extracted, the aimed property can be obtained easily and by the light of nature not only by extracting the property from every time segment but also by extracting the property from every plurality of adjacent time segments.

Here, as for one and the same waveform data captured in the acquisition memory 6, the information about the number of pulses contained in each time segment has been stored (see FIG. 34). Therefore, without detecting pulse signals again, the conditions which are the easiest to identify the property of the waveform can be produced by changing the set range of the number of pulses to be extracted and thereby changing the way to reflect on the basis of brightness information. It is therefore possible to obtain the aimed property from the compressed and displayed waveform data easily and by the light of nature.

Next, description will be made on a specific example of a processing method in which, when a part of the entire compressed waveform with the property of the waveform being identified by the processing is observed in further detail, a waveform portion in each time segment having a specific value within a set range is zoomed in on automatically with optimum setting.

FIG. 44 shows a display example in which the range of the number of pulses in two adjacent time segments is set to be not smaller than 7 and not larger than 9 upon the waveform data in FIG. 31. FIG. 44 shows that adjacent time segments R–S, K–L, Q–P and T–U are portions having the specified property.

Here, in the case where the waveform with the number of pulses not smaller than 7 and not larger than 9 is observed in detail, time segments with the highest brightness shown by the black lines are zoomed in on and observed manually in FIG. 44 if the invention is not applied. However, according to this embodiment, the desired portions can be automatically zoomed in on and observed in the optimum conditions easily as follows.

That is, as described previously, the user operates the operating button of the operating portion 13 so as to input an instruction to observe the details. Then, the microprocessor 10 extracts values expressing the specified property suited to the set range.

FIG. 45 shows data stored in the main memory 11 when the range of the number of pulses to be extracted from the waveform data in FIG. 31 is set to be not smaller than 7 and not larger than 9 and an instruction to observe the details is inputted. The data is constituted by adjacent time segments each having a value of the number of pulses within the set range, the start addresses thereof, and the numbers of pulses contained therein.

Now, here, assume that no time segment to be zoomed in on has not been specified by the user. Since the range to extract the property is set with the upper and lower limits, waveforms of suited time segments are zoomed in on automatically and sequentially, for example, from the left end of the screen in the state in which the details thereof can be recognized.

On the contrary, when a time segment to be zoomed in on is specified by the user, only the waveform data in the specified time segment in the conditions is zoomed in on automatically.

Here, there is shown an example in which data in time segments each having a value of the number of pulses within the set range is zoomed in on automatically and sequentially from the left of the screen. At this time, in the same manner as in the example, the screen of the LCD 9 is divided into two in an up/down direction. The entire compressed waveform which has been displayed till then is compressed to a half size in the vertical direction and displayed in the upper half area of the screen. Then, the zoomed waveform of the details is displayed in the lower half area of the screen.

When an instruction to zoom in is executed, first of all, setting for displaying the waveform in the optimum conditions is made automatically by use of the address of the waveform data in the adjacent time segment R–S in FIG. 36. (See the flow charts of FIGS. 8 to 15).

Next, when an instruction to display the second section is executed, the adjacent time segment K–L is displayed by similar processing. Next, when an instruction to display the third section is executed, the adjacent time segment O–P is displayed by similar processing.

FIG. 46 shows an example in which the entire compressed waveform identifying the property of the waveform and the zoomed waveform in the adjacent time segment K–L are displayed on the same screen. Here, the cursor 21 is displayed to be superimposed on the portion of the time segment K–L so as to make it clear which portion of the entire compressed waveform is zoomed in on. In the same manner as described previously, the position of the zoomed waveform data may be identified by varying brightness, color, density, an identifying mark, or the like, besides the identification using the cursor 21.

Although FIG. 46 has shown the example in which the entire compressed waveform identifying the property of the waveform and a zoomed portion thereof are displayed on the same screen, the following manner may be adopted in an apparatus having two LCD screens. That is, the entire compressed waveform is displayed on one of the two screens while the zoomed waveform is displayed on the other screen.

Although the specific examples have shown the case where the number of pulses is specified as a property of a waveform having only one value expressing the specified property in each time segment, an operation similar to the aforementioned one is carried out also in the case where a property about a root mean square value, an average value, a maximum value, a minimum value, a difference between the maximum value and the minimum value, or the frequency of occurrence of data in a specific section is specified in digital data forming a waveform displayed on the screen.

In that case, when a root mean square value is specified as a property, the arithmetic processing portion 14 or the microprocessor 10 obtains the position of waveform data in each time segment, and the root mean square value of data in the time segment, and sets the obtained root mean square value as a value expressing the property of the time segment.

When an average value is specified as a property, the arithmetic processing portion 14 or the microprocessor 10 obtains the position of waveform data in each time segment, and the average value of data in the time segment, and sets the obtained average value as a value expressing the property of the time segment.

When a maximum value is specified as a property, the arithmetic processing portion 14 or the microprocessor 10 obtains the position of waveform data in each time segment, and the maximum value of data in the time segment, and sets the obtained maximum value as a value expressing the property of the time segment.

When a minimum value is specified as a property, the arithmetic processing portion 14 or the microprocessor 10 obtains the position of waveform data in each time segment, and the minimum value of data in the time segment, and sets the obtained minimum value as a value expressing the property of the time segment.

When a value (P—P value) of the difference between the maximum value and the minimum value is specified as a property, the arithmetic processing portion 14 or the microprocessor 10 obtains the position of waveform data in each time segment, and the maximum value and the minimum value of data in the time segment, further obtains the absolute value (P—P value) of the difference between the maximum value and the minimum value, and sets the obtained P—P value as a value expressing the property of the time segment.

When a property about the frequency of occurrence of data in a specified section is specified as a property, the arithmetic processing portion 14 or the microprocessor 10 obtains the position of waveform data in each time segment, and the frequency of occurrence of data in the time segment between two specified threshold values, and sets the value of the frequency of occurrence as a value expressing the property of the time segment.

Incidentally, the properties of a waveform listed in the description are illustrated by way of example. Not to say, properties of a waveform to be treated in the invention are not limited to these properties.

In addition, although description has been made on the case where the entire waveform of the waveform data in the acquisition memory 6 is designed to be displayed by compressed display data, the following manner can be considered if the capacity of the memory is large. That is, a waveform data portion which is a part of the waveform data is divided into a plurality of time segments in the same manner as described above, so that a compressed waveform thereof is displayed. The invention is also applicable to such a case.

As described above, according to the invention, a waveform is displayed by use of compressed data generated on the basis of digital waveform data captured in a memory. To this end, even in the case where it may be difficult to observe the details of the waveform from the waveform display, a specified property of the waveform is extracted from the digital waveform data in the memory so that the result thereof is reflected on the waveform display. Accordingly, the property of the waveform data can be grasped easily and by the light of nature.

In addition, according to the invention, the specified property portion of the waveform can be zoomed in on automatically, so that the details of the waveform displayed in compression can be observed easily.

What is claimed is:

1. A waveform information display apparatus comprising:
   an A/D converting unit for converting an analog input signal into digital waveform data;
   a unit for storing said digital waveform data into a memory;
   a unit for dividing said digital waveform data stored in said memory into a plurality of time segments, and generating compressed display data including at least two values for each of said time segments so as to display a waveform on a screen;
   a first operating unit for specifying a property to be observed upon a waveform of said analog input signal;
   an arithmetic processing unit for extracting said property specified through said first operating unit, from said digital waveform data for each of said time segments, and carrying out an arithmetic processing in accordance with said extracted property so as to obtain a value expressing said specified property in said time segment; and
   a display control unit for controlling a waveform display portion in each of said time segments to be displayed on said screen in accordance with said compressed display data for each of said time segments, and displaying said waveform display portion in a state in which said value expressing said property extracted by said arithmetic processing unit is reflected on said waveform display portion.

2. The waveform information display apparatus according to claim 1, wherein
   said specified property allows a plurality of waveform portions having said property to exist in each of said time segments,
   a second operating unit is provided for setting a range to be watched as to said value expressing said specified property;
   said arithmetic processing unit includes:
   a unit for calculating a minimum value of said value expressing said property in each of said time segments as a value expressing a property of said time segment, when said range set by said second operating unit is made not larger than an upper limit reference value;
   a unit for calculating a maximum value of said value expressing said property in each of said time segments as a value expressing a property of said time segment, when said range set by said second operating unit is made not smaller than a lower limit reference value; and
   a unit for calculating a frequency of occurrence of said value expressing said property in each of said time segments and agreeing with said set range as a value expressing a property of said time segment, when said range set by said second operating unit is made not smaller than said lower limit reference value and not larger than said upper limit reference value; and
   said display control unit includes a unit for reflecting said value expressing said specified property in each of said time segments and obtained by said arithmetic processing step on said waveform display portion in each of said time segments displayed on said screen.

3. The waveform information display apparatus according to claim 2, wherein
   said display control unit includes:
   a unit by which, when said set range is not larger than said upper limit reference value or not smaller than said lower limit reference value, said range is divided into a plurality of classes, and a way of said reflection is assigned to each of said split range classes so as to change in accordance with said split range classes; when said value expressing said property in a time segment is a value out of said set range, a way of reflection different from said way of reflection assigned to said split range classes is evenly assigned to said value out of said set range, so that said value expressing said property in each of said time segments is reflected on a waveform display portion in said time segment in said way of reflection assigned to a split class in which said value expressing said property is included; and
   a unit by which when said set range is not smaller than said lower limit reference value and not larger than said upper limit reference value, said way of reflection is determined in accordance with presence/absence of a value expressing said property within said set range; said way of reflection different from said way of reflection in accordance with said presence/absence is assigned evenly to any value out of said set range, so that said value expressing said property in each of said time segments is reflected on a waveform display portion in said time segment in said way of reflection assigned to a split class in which said value expressing said property is included.

4. The waveform information display apparatus according to claim 2, wherein said property specified by said first operating unit is at least one of pulse width of a positive pulse, pulse width of a negative pulse, a frequency, a period, duty ratio, rise time, and fall time.

5. The waveform information display apparatus according to claim 1, wherein said specified property has only one value expressing said property in each of said time segments;

said arithmetic processing unit has a unit by which a value of said property specified by said first operating unit is calculated in each of said time segments in a predetermined method, and said calculated value expressing said property is obtained as a value expressing said specified property in each of said time segments; and said display control unit has a unit for reflecting said value expressing said specified property in each of said time segments and obtained by said arithmetic processing unit on a waveform display portion in each of said time segments displayed on said screen.

6. The waveform information display apparatus according to claim 5, wherein said display control unit has a unit for determining a way of reflection onto said waveform display portion in each of said time segments in accordance with a predetermined set range and in accordance with said value expressing said specified property in each of said time segments.

7. The waveform information display apparatus according to claim 5, wherein said property specified by said first operating unit is at least one of a number of pulses, a root mean square value of waveform data, an average value of waveform data, a maximum value of waveform data, a minimum value of waveform data, a difference between said maximum value and said minimum value of said waveform data, and a frequency of occurrence of data in each of said time segments.

8. The waveform information display apparatus according to claim 2, wherein said arithmetic operating unit includes a unit for extracting a waveform portion having said specified property from each of said time segments, and a unit for storing an address position of said extracted waveform portion on said memory; and said waveform information display apparatus further comprising:

a third operating unit for inputting an instruction to observe details about said specified property; and a detail display unit for zooming in on waveform portions having values within said set range in all of said time segments in an order determined by said set range, when said instruction to observe said details about said specified property is given through said third operating unit.

9. The waveform information display apparatus according to claim 2, wherein said arithmetic operating unit includes a unit for extracting and storing a value expressing said specified property in each of said time segments; and said waveform information display apparatus further comprising:

a third operating unit for specifying a time segment whose details about said specified property suited to said set range are to be observed; and a detail display unit for zooming in on time segments having values within said set range in an order determined by said set range, when an instruction to specify a time segment whose details about said specified property are to be observed is given through said third operating unit.

10. The waveform information display apparatus according to claim 5, wherein said arithmetic operating unit includes a unit for extracting and storing a value expressing said specified property in each of said time segments; and said waveform information display apparatus further comprising:

a third operating unit for inputting an instruction to observe details about said specified property suited to said set range; and a detail display unit for zooming in on time segments having values within said set range in an order determined by said set range, when said instruction to observe details about said specified property is given through said third operating unit.

11. The waveform information display apparatus according to claim 5, wherein said arithmetic operating unit includes a unit for extracting and storing a value expressing said specified property in each of said time segments; and said waveform information display apparatus further comprising:

a third operating unit for inputting an instruction to specify a time section whose details about said specified property are to be observed; and a detail display unit for zooming in on said specified time segment, when said instruction to specify a time section whose details about said specified property are to be observed is given through said third operating unit.

12. The waveform information display apparatus according to claim 8, further comprising:

a unit for displaying a compressed waveform using compressed display data in said respective time segments of waveform data stored in said memory, and said zoomed waveform on one and the same screen or different screens; and a unit for displaying to identify a position of a time segment including said zoomed waveform on said compressed waveform is carried out on said one and the same screen or one of said different screens.

13. The waveform information display apparatus according to claim 9, further comprising:

a unit for displaying a compressed waveform using compressed display data in said respective time segments of waveform data stored in said memory, and said zoomed waveform on one and the same screen or different screens; and a unit for displaying to identify a position of a time segment including said zoomed waveform on said compressed waveform is carried out on said one and the same screen or one of said different screens.

14. The waveform information display apparatus according to claim 10, further comprising:

a unit for displaying a compressed waveform using compressed display data in said respective time segments of waveform data stored in said memory, and said zoomed waveform on one and the same screen or different screens; and a unit for displaying to identify a position of a time segment including said zoomed waveform on said compressed waveform is carried out on said one and the same screen or one of said different screens.

15. The waveform information display apparatus according to claim 11, further comprising:

a unit for displaying a compressed waveform using compressed display data in said respective time segments of waveform data stored in said memory, and said zoomed waveform on one and the same screen or different screens; and a unit for displaying to identify a position of a time segment including said zoomed waveform on said compressed waveform is carried out on said one and the same screen or one of said different screens.

16. The waveform display apparatus according to claim 1, wherein said compressed display data includes as the at least two values a maxim value and a minim value of the waveform data in the corresponding time segment.

* * * * *